(12) United States Patent
Jarrahi et al.

(10) Patent No.: US 11,112,305 B2
(45) Date of Patent: *Sep. 7, 2021

(54) PHOTOCONDUCTIVE DETECTOR DEVICE WITH PLASMONIC ELECTRODES

(71) Applicant: The Regents of the University of California, Oakland, CA (US)

(72) Inventors: Mona Jarrahi, Los Angeles, CA (US); Christopher W. Berry, Mountain View, CA (US); Ning Wang, Mountain View, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/792,575

(22) Filed: Oct. 24, 2017

(65) Prior Publication Data
US 2018/0058931 A1    Mar. 1, 2018

Related U.S. Application Data

(62) Division of application No. 14/372,779, filed as application No. PCT/US2013/022776 on Jan. 23, 2013, now Pat. No. 9,804,026.
(Continued)

(51) Int. Cl.
*H01L 31/09*     (2006.01)
*H01L 31/0224*   (2006.01)
(Continued)

(52) U.S. Cl.
CPC .......... *G01J 3/108* (2013.01); *H01L 31/0224* (2013.01); *H01L 31/02327* (2013.01);
(Continued)

(58) Field of Classification Search
CPC ...................................................... G01J 3/108
See application file for complete search history.

(56) References Cited

U.S. PATENT DOCUMENTS 6,173,604 B1   1/2001  Xiang et al.
6,529,093 B2   3/2003  Ma
(Continued)

FOREIGN PATENT DOCUMENTS

EP   1804347 A1   7/2007
EP   2807675 A1   12/2014
(Continued)

OTHER PUBLICATIONS

Ping, et al., "Detection of Terahertz Radiation from Longitudinal Optical Phonon-Plasmon Coupling Modes Insb Film Using an Ultrabroadband Photoconductive Antenna", Applied Physics Letters, American Institute of Physics, vol. 77, No. 12, Sep. 18, 2000, pp. 1798-1800.
(Continued)

*Primary Examiner* — David P Porta
*Assistant Examiner* — Carolyn Fin
(74) *Attorney, Agent, or Firm* — KPPB LLP

(57) ABSTRACT

A photoconductive device that includes a semiconductor substrate, an antenna assembly, and a photoconductive assembly with one or more plasmonic contact electrodes. The photoconductive assembly can be provided with plasmonic contact electrodes that are arranged on the semiconductor substrate in a manner that improves the quantum efficiency of the photoconductive device by plasmonically enhancing the pump absorption into the photo-absorbing regions of semiconductor substrate. In one exemplary embodiment, the photoconductive device is arranged as a photoconductive source and is pumped at telecom pump
(Continued)

wavelengths (e.g., 1.0-1.6 μm) and produces milliwatt-range power levels in the terahertz (THz) frequency range.

19 Claims, 13 Drawing Sheets

Related U.S. Application Data

(60) Provisional application No. 61/589,486, filed on Jan. 23, 2012.

(51) Int. Cl.
*H01L 31/0232* (2014.01)
*H01L 31/0352* (2006.01)
*H01L 33/38* (2010.01)
*G01J 3/10* (2006.01)
*H01L 33/04* (2010.01)

(52) U.S. Cl.
CPC ...... *H01L 31/035209* (2013.01); *H01L 31/09* (2013.01); *H01L 33/04* (2013.01); *H01L 33/38* (2013.01)

(56) References Cited

U.S. PATENT DOCUMENTS

| | | |
|---|---|---|
| 7,321,275 B2 | 1/2008 | Chou et al. |
| 7,515,801 B2 | 4/2009 | McCaughan et al. |
| 7,599,409 B2 | 10/2009 | Nishizawa et al. |
| 7,710,637 B2 | 5/2010 | Ikari et al. |
| 7,834,722 B2 | 11/2010 | Millet |
| 7,915,641 B2 | 3/2011 | Otsuji et al. |
| 8,450,687 B2 | 5/2013 | Lampin et al. |
| 8,466,528 B2 | 6/2013 | Okamoto et al. |
| 8,514,403 B2 | 8/2013 | Ogawa et al. |
| 8,581,784 B2 | 11/2013 | Nagel |
| 8,610,094 B2 | 12/2013 | Kim et al. |
| 8,649,414 B2 | 2/2014 | Park |
| 8,730,567 B2 | 5/2014 | Kim et al. |
| 9,804,026 B2 | 10/2017 | Jarrahi |
| 9,859,079 B2 | 1/2018 | Jarrahi et al. |
| 10,120,263 B2 | 11/2018 | Jarrahi |
| 10,863,895 B2 | 12/2020 | Jarrahi |
| 2001/0011704 A1 | 8/2001 | Niwa et al. |
| 2003/0184328 A1 | 10/2003 | Lee et al. |
| 2004/0095147 A1 | 5/2004 | Cole |
| 2005/0236260 A1 | 10/2005 | Pasch et al. |
| 2006/0153262 A1 | 7/2006 | Barbieri et al. |
| 2007/0216422 A1 | 9/2007 | Sekiguchi |
| 2007/0278075 A1 | 12/2007 | Terano et al. |
| 2008/0001691 A1 | 1/2008 | Hong et al. |
| 2008/0277672 A1 | 11/2008 | Hovey et al. |
| 2009/0259102 A1 | 10/2009 | Koninckx et al. |
| 2009/0261362 A1 | 10/2009 | Ueda et al. |
| 2009/0273532 A1 | 11/2009 | Mandis et al. |
| 2010/0002739 A1 | 1/2010 | Hu et al. |
| 2010/0017922 A1 | 1/2010 | Shin et al. |
| 2010/0102256 A1 | 4/2010 | Andrew et al. |
| 2010/0277726 A1 | 11/2010 | Logan et al. |
| 2011/0028824 A1 | 2/2011 | Cole et al. |
| 2011/0074293 A1 | 3/2011 | Hagmann et al. |
| 2011/0080329 A1 | 4/2011 | Nagel |
| 2011/0141468 A1 | 6/2011 | Kukushkin et al. |
| 2011/0149368 A1 | 6/2011 | Kim et al. |
| 2011/0215246 A1 | 9/2011 | Kajiki |
| 2012/0122259 A1 | 5/2012 | Tung et al. |
| 2012/0147907 A1 | 6/2012 | Kim et al. |
| 2012/0162747 A1 | 6/2012 | Kim et al. |
| 2012/0205767 A1 | 8/2012 | Bai et al. |
| 2012/0294549 A1 | 11/2012 | Doepke |
| 2013/0015375 A1 | 1/2013 | Avouris et al. |
| 2013/0161514 A1 | 6/2013 | Kukushkin et al. |
| 2013/0161541 A1 | 6/2013 | Kim et al. |
| 2013/0284929 A1 | 10/2013 | Ouchi |
| 2014/0103211 A1 | 4/2014 | Darcie et al. |
| 2014/0198973 A1 | 7/2014 | Zhang et al. |
| 2014/0346357 A1 | 11/2014 | Jarrahi et al. |
| 2016/0064110 A1 | 3/2016 | Schmadel et al. |
| 2016/0116406 A1 | 4/2016 | Hunt et al. |
| 2016/0196943 A1 | 7/2016 | Jarrahi et al. |
| 2016/0305869 A1 | 10/2016 | Mann et al. |
| 2017/0123292 A1 | 5/2017 | Jarrahi |
| 2019/0150719 A1 | 5/2019 | Jarrahi |
| 2020/0064259 A1 | 2/2020 | Jarrahi et al. |
| 2020/0264048 A1 | 8/2020 | Jarrahi et al. |

FOREIGN PATENT DOCUMENTS

| | | |
|---|---|---|
| EP | 3155702 A1 | 4/2017 |
| EP | 3302224 A2 | 4/2018 |
| EP | 2807675 B1 | 9/2018 |
| EP | 3302224 B1 | 10/2020 |
| EP | 3155702 B1 | 12/2020 |
| JP | 2002511690 A | 4/2002 |
| JP | 2002511960 A | 4/2002 |
| JP | 2006216646 A | 8/2006 |
| JP | 2008122278 A | 5/2008 |
| JP | 2009105102 A | 5/2009 |
| JP | 2009531841 A | 9/2009 |
| JP | 2010510703 A | 4/2010 |
| JP | 2014112078 A | 6/2014 |
| JP | 2015513067 A | 4/2015 |
| JP | 6169614 B2 | 7/2017 |
| JP | 2017523601 A | 8/2017 |
| JP | 2018516667 A | 6/2018 |
| KR | 1020080004467 A | 1/2008 |
| WO | WO9846042 A1 | 10/1998 |
| WO | 2005019810 A2 | 3/2005 |
| WO | 2005019810 A3 | 5/2005 |
| WO | WO2006030608 A1 | 3/2006 |
| WO | 2010011186 A1 | 1/2010 |
| WO | WO2010021073 A1 | 2/2010 |
| WO | WO2010044193 A1 | 4/2010 |
| WO | WO2011028179 A1 | 3/2011 |
| WO | WO2011118398 A1 | 9/2011 |
| WO | WO2011129690 A2 | 10/2011 |
| WO | 2012057710 A1 | 5/2012 |
| WO | 2013112608 A1 | 8/2013 |
| WO | 2015021100 A1 | 2/2015 |
| WO | 2015192094 | 12/2015 |
| WO | 2016196309 A2 | 12/2016 |
| WO | 2016196309 A3 | 2/2017 |
| WO | 2018195429 A1 | 10/2018 |

OTHER PUBLICATIONS

Tsuda et al., Application of Plasmon-Resonant Microchip Emitters to Broadband Terahertz Spectroscopic Measurement, Journal of Optical Society of America B, vol. 26, No. 9, Sep. 1, 2009, p. A52, 6 total pages.
Tanigawa et al., "Enhanced Responsivity in a Novel AlGaN / GaN Plasmon-Resonant Terahertz Detector Using Gate-Dipole Antenna with Parasitic Elements", Device Research Conference (DRC), 2010, IEEE, Piscataway, NJ, Jun. 21, 2010, pp. 167-168.
Sun et al., "Room Temperature GaN/AlGaN Self-Mixing Terahertz Detector Enhanced by Resonant Antennas", Applied Physics Letters, American Institute of Physics, vol. 98, No. 25, Jun. 20, 2011, p. 252103, 3 total pages.
International Search Report for application No. PCT/US2013/022776, dated May 16, 2013, 3 pages.
Written Opinion for application No. PCT/US2013/022776, dated May 16, 2013, 6 pages.
European Search Report corresponding to EP application No. 13741491.8 / 2807675, dated Oct. 12, 2015, 6 pages.
European Examination Report corresponding to EP application No. 13741491.8 , dated Oct. 21, 2015, 5 pages.
Berry et al., "Terahertz generation using plasmonic photoconductive gratings", New Journal of Physics, 2012, vol. 14, 12 pgs.
Brown et al., "Characterization of a Planar Self-Complementary Square-Spiral Antenna in the THz Region", Microwave and Optical

(56) References Cited

OTHER PUBLICATIONS

Technology Letters, vol. 48, No. 3, Mar 2006, pp. 524-529.
Brown et al., "Coherent millimeter-wave generation by heterodyne conversion in low-temperaturue-grown GaAs photoconductors", Journal of Applied Physics, Feb. 1, 1993, vol. 3, pp. 1480-1484.
Cassel et al., "Aflatoxins: Hazards in Grain/Aflatoxicosis and Livestock", South Dakota State University, Fact Sheets, Oct. 1, 2001, Paper 86, 5 pgs.
Catrysse et al., "Guided modes supported by plasmonic films with a periodic arrangement of subwavelength slits", Applied Physics Letters, 2006, vol. 88, pp. 031101-1-031101-3.
Chimot et al., "Photomixing at 1.55 µm in ion-irradiated In0.53GA. 47As on InP", Optics Express, Mar. 6, 2006, vol. 14, No. 4, pp. 1856-1861.
Delmulle et al., "Development of an Immunoassay-Based Lateral Flow Dipstick for the Rapid Detection of Aflatoxin B1 in Pig Feed", Journal of Agriculture and Food Chemistry, Apr. 8, 2005, vol. 53, No. 9, pp. 3364-3368, https://doi.org/10.1021/jf0404804.
Hsieh et al., "Analysis of periodic metallic nano-slits for efficient interaction of terahertz and optical waves at nano-scale dimensions", Journal of Applied Physics, 2011, vol. 109, pp. 084326-1-084326-5.
Humphreys et al., "Medical applications of terahertz imaging: a review of current technology and potential applications in biomedical engineering", Proceedings of the 26th Annual International Conference of the IEEE EMBS San Francisco, CA, USA Sep. 1-5, 2004, pp. 1302-1305.
Kokkonen et al., "Determination of selected mycotoxins in mould cheeses with liquid chromatography coupled to tandem with mass spectrometry", Food Additives and Contaminants, May 2005, vol. 22, No. 5, pp. 449-456.
Krishnamachari et al., "Hepatitis due to aflatoxicosis, An outbreak in Western India", Lancet, May 10, 1975, vol. 305, Issue 7915, pp. 1061-1063, DOI:https://doi.org/10.1016/S0140-6736(75)91829-2.
Malone et al., "Determination of Aflatoxins in Grains and Raw Peanuts by a Rapid Procedure with Fluorometric Analysis", Journal of AOAC International, 2000, vol. 83, No. 1, pp. 95-98.
Mangeney et al., "Continuous wave terahertz genereation up to 2 THz by photomixing on ion-irradiated in0.53GA0.47As at 1.55 µm wavelengths", Applied Physics Letters, vol. 91, 2007, pp. 241102-1-241102-3.
Middendorf et al., "THz generation using extrinsic photoconductivity at 1550 nm", Optics Express, Jul. 16, 2012, vol. 20, No. 15, pp. 16504-16509.
Park et al., "Terahertz photoconductive antenna with meal nanoislands", Optics Express, Nov. 5, 2012, vol. 20, No. 23, 6 pgs.
Pearson et al., "Detecting aflatoxin in single corn kernels by transmittance and reflectance spectroscopy", Transactions of the AWAE, vol. 44, No. 5, pp. 1247-1254.
Peytavit et al., "Continuous terahertz-wave generation using a monolithically integrated horn antenna", Applied Physics Letters, 2008, vol. 93, pp. 111108-1-111108-3.
Preu et al., "Tunable, continuous-wave Terahertz photomixer sources and applications", Journal of Applied Physics, 2011, vol. 109, pp. 016301-1-061301-56.
Schmale et al., "Mycotoxins in Crops: A Threat to Human and Domestic Animal Health", The Plant Health Instructor, 2009, vol. 3, pp. 340-353, doi: 10.1094/PHI-I-2009-0715-01.
Takazato et al., "Detection of terahertz waves using low-temperature-grown InGaAs with 1.56 µm pulse excitation", Appl. Phys. Lett. 90, 101119, 2007, pp. 1011191-1011119-3
Wacoo et al., "Methods for Detection of Aflatoxins in Agricultural Food Crops", Journal of Applied Chemistry, Nov. 2014, vol. 214, No. 706291, 15 pgs. doi:10.1155/2014/706291.
Extended European Search Report for European Application No. 15807544.0, Search completed Jun. 12, 2018, dated Jun. 20, 2018, 8 pgs.
Extended European Search Report for European Application No. 16804130.9, Search completed Jan. 16, 2019, dated Jan. 25, 2019, 6 pgs.

International Preliminary Report on Patentability for International Application PCT/US2013/022776, Report issued Jul. 29, 2014, dated Aug. 7, 2014, 7 pgs.
International Preliminary Report on Patentability for International Application PCT/US2014/049866, Report issued Feb. 9, 2016, dated Feb. 18, 2016, 7 pgs.
International Preliminary Report on Patentability for International Application PCT/US2015/035685, Report issued Dec. 15, 2016, dated Dec. 22, 2016, 6 pgs.
International Preliminary Report on Patentability for International Application PCT/US2016/034704, Report issued Nov. 28, 2017, dated Dec. 7, 2017, 9 pgs.
International Preliminary Report on Patentability for International Application PCT/US2018/028579, Report issued Oct. 22, 2019, dated Oct. 31, 2019, 7 pgs.
International Search Report and Written Opinion for International Application PCT/US2015/035685, Report Completed Aug. 27, 2015, dated Aug. 27, 2015, 8 pgs.
International Search Report and Written Opinion for International Application No. PCT/US2014/049866, Search completed Nov. 19, 2014, dated Nov. 20, 2014, 9 pgs.
International Search Report and Written Opinion for International Application No. PCT/US2016/034704, Search completed Dec. 26, 2016, dated Dec. 6, 2016, 11 pgs.
International Search Report and Written Opinion for International Application No. PCT/US2018/028579, Search completed Jul. 5, 2018, dated Jul. 20, 2018, 11 pgs.
"Mycotoxins: Risks in Plant, Animal and Human Systems", Council for Agriculture, Task Force Report, Jan. 2003, No. 139, 217 pgs (presented in two parts).
Alshannaq et al., "Controlling aflatoxin contamination and propagation of Aspergillus flavus by a soy-fermenting Aspergillus oryzae strain", Scientific Reports, Nov. 15, 2018, vol. 8, No. 16871, 14 pgs, doi: 10.1038/s41598-018-35246-1.
Bennett et al., "Aflatoxins: Background, Toxicology, and Molecular Biology", Foodborne Diseases, 2007, Humana Press, pp. 355-373, doi: 10.1007/978-1-59745-501-5_13.
Berry et al., "Design, Fabrication, and Experimental Characterization of Plasmonic Photoconductive Terahertz Emitters", Journal of Visualized Experiments, Jul. 2013, vol. 77, pp. e505171-e505178.
Berry et al., "Generation of high power pulsed terahertz radiation using a plasmonic photoconductive emitter array with logarithmic spiral antennas", Applied Physics Letters, 2014, vol. 104, 081122, pp. 081122-1-081122-4.
Berry et al., "High Power Terahertz Generation Using 1550 nm Plasmonic Photomixers", Applied Physics Letters, vol. 105, pp. 011121-1-011121-4, 2014, Published online Jul. 2014.
Berry et al., "Nanoscale Contact Electrodes for Significant Radiation Power Enhancement in Photoconductive Terahertz Emitters", IEEE, 2013, 4 pgs.
Berry et al., "Plasmonic photomixers for increased terahertz radiation powers at 1550 nm optical pump wavelength", IEEE, 2014, 3 pgs.
Berry et al., "Plasmonically-Enhanced Localization of Light into Photoconductive Antennas", IEEE 2010 Conference on Lasers and Electro-Optics (CLEO) and Quantum Electronics and Laser Science Conference (QELS), Conference Date May 16-21, 2010, San Jose, California, 2 pgs.
Berry et al., "Plasmonics Enhanced Photomixing for Generating Quasi-Continuous-Wave Frequency-Tunable Terahertz Radiation", Optics Letters, Aug. 1, 2014, vol. 39, No. 15, pp. 4522-4524.
Berry et al., "Principles of Impedance Matching in Photoconductive Antennas", Journal of Infrared, Millimeter and Terahertz Waves, vol. 33, No. 12, published online Sep. 27, 2012, pp. 1182-1189, doi: 10.1007/s10762-012-9937-3.
Berry et al., "Significant performance enhancement in photoconductive terahertz optoelectronics by incorporating plasmonic contact electrodes", Nature Communication, vol. 4, Mar. 27, 2013, 10 pgs.
Extended European Search Report for European Application No. 18787213.0, Search completed Nov. 30, 2020, dated Dec. 9, 2020, 7 Pgs.

(56) References Cited

OTHER PUBLICATIONS

International Search Report and Written Opinion for International Application No. PCT/US2020/053860, Search completed Nov. 30, 2020, dated Jan. 6, 2021, 13 Pgs.

Baek et al., "Detection of melamine in foods using terahertz time-domain spectroscopy", Journal of Agriculture and Food Chemistry, Jun. 2, 2014, vol. 62, pp. 5403-5407, Dx.doi.org/10.1021/jf501170z.

Baker et al., "Self-triggered Asynchronous Optical Sampling Terahertz Spectroscopy using a Bidirectional Mode-locked Fiber Laser", Scientific Reports, Oct. 4, 2018, vol. 8, No. 1:14802, doi:10.1038/s41598-018-33152-0.

Castro-Camus et al., "Leaf water dynamics of Arabidopsis thaliana monitored in-vivo using terahertz time-domain spectroscopy", Scientific Reports, Oct. 9, 2013, vol. 3, Article No. 2910, pp. 1-5, doi: 10.1038/srep2910.

Chen et al., "A preliminary study of aflatoxin B1 detection in peanut oil by terahertz time-domain spectroscopy", Transactions of the ASABE, 2017, vol. 57, No. 6, pp. 1793-1799.

Food and Drug Administration, "Action levels for added poisonous or deleterious substances in food".

Ge et al., "Quantitative determination of aflatoxin B1 concentration in acetonitrile by chemometric methods using terahertz spectroscopy", Food Chemistry, Oct. 15, 2016, vol. 209, pp. 286-292, doi.org/10.1016/j.foodchem .2016.04.070.

Gowen et al., "Terahertz time domain spectroscopy and imaging: Emerging techniques for food process monitoring and quality control", Trends in Food Science & Technology, May 2012, vol. 25, Issue 1, pp. 40-46.

Grischkowsky et al., "Far-infrared time-domain spectroscopy with terahertz beams of dielectrics and semiconductors", Journal of the Optical Society of America B, 1990, vol. 7, Issue 10, pp. 2006-2015, https://doi.Org/10.1364/JOSAB.7.002006.

Jarrahi, "Advanced Photoconductive Terahertz Optoelectronics Based on Nano-Antennas and Nano-Plasmonic Light Concentrators", IEEE Transactions on Terahertz Science and Technology, May 2015, vol. 5, Issue 3, pp. 391-397, Doi: 10.1109/TTHZ.2015.2406117.

Li et al., "A polarization-insensitive plasmonic photoconductive terahertz emitter", AIP Advances, Nov. 16, vol. 7, No. 11, p. 115113-1-15513-6, doi.org/10.1063/1.5006273 Nov. 16, 2017.

Parrott et al., "Terahertz spectroscopy: Its future role in medical diagnoses", Journal of Molecular Structure, Dec. 14, 2011, vol. 1006, Issues 1-3, pp. 66-76, doi.org/10.1016/j.molstruc.2011.05.048.

Pupeza et al., "Highly Accurate Optical Material Parameter Determination With THz Time-Domain Spectroscopy", Optics Express, Apr. 2, 2007, vol. 15, No. 7, pp. 4335-4350. doi: 10.1364/oe.15.004335.

Qu et al., "Review of theoretical methods and research aspects for detecting Teaf water content using terahertz spectroscopy and imaging", International Journal of Agricultural and Biological Engineering, Sep. 2018, vol. 11, No. 5, pp. 27-34.

Tonouchi, "Cutting-edge terahertz technology", Nature Photonics, vol. 1, No. 2, Feb. 2007, pp. 97-105.

Turan et al., "Impact of the Metal Adhesion Layer on the Radiation Power of Plasmonic Photoconductive Terahertz Sources", Journal of Infrared, Millimeter, and Terahertz Waves, Aug. 28, 2017, vol. 38, pp. 1448-1456.

Ueno et al., "Quantitative measurements of amino acids by terahertz time-domain transmission spectroscopy", Analytical Chemistry, Jun. 29, 2006, vol. 78, No. 15, pp. 5424-5428, doi.org/10.1021/ac060520y.

Wang et al., "Terahertz Imaging Applications in Agriculture and Food Engineering: A Review", Transactions of the ASABE. Jan. 2018, vol. 61, No. 2, pp. 411-424, DOI: 10.13031/trans.12201.

Yang et al., "Frequency-tunable continuous-wave terahertz sources based on GaAs plasmonic photomixers", Applied Physics Letters, Sep. 2015, vol. 107, No. 13, 131111, doi.org/10.1063/1.4932114.

Yang et al., "Tunable terahertz wave generation through a bimodal laser diode and plasmonic photomixer", Optics Express, Nov. 30, 2015, vol. 23, Issue 24, p. 31206-31215, doi.org/10.1364/OE.23.031206.

Yardimci et al., "A High-Power Broadband Terahertz Source Enabled by Three-Dimensional Light Confinement in a Plasomic Nanocavity", Scientific Reports, Jun. 23, 2017, vol. 7, No. 4166, pp. 1-8, doi: 10.1038/S41598-07-04553-4.

Yardimci et al., "A high-responsivity and broadband photoconductive terahertz detector based on a plasmonic nanocavity", Applied Physics Letters, Dec. 18, 2018, vol. 113, Issue 25, doi.org/10.1063/1.5066243.

Yardimci et al., "High Sensitivity Terahertz Detection through Large-Area Plasmonic NanoAntenna Arrays", Scientific Reports, vol. 7, article 42667, Feb. 16, 2017 (Feb. 16, 2017), pp. 1-8.

Yardimci et al., "High-Power Terahertz Generation Using Large-Area Plasmonic Photoconductive Emitters", IEEE Transactions on Terahertz Science and Technology, Mar. 2015, vol. 5, Issue 2, pp. 223-229, DOI: 10.1109/TTHZ.2015.2395417.

Yardimci et al., "Nanostructure-Enhanced Photoconductive Terahertz Emission and Detection", Small, Nov. 2, 2018, vol. 14, Issue 44, first published Aug. 28, 2018, doi.org/10.1002/smll.201802437.

Zhang et al., "Simultaneous determination of amino acid mixtures in cereal by using terahertz time domain spectroscopy and chemometrics", Chemometrics and Intelligent Laboratory Systems, May 15, 2017, vol. 164, No. 15, pp. 8-15, DOI: 10.1016/j.chemolab.2017.03.001.

Berry et al., "Ultrafast Photoconductors based on Plasmonic Gratings", IEEE 2011 36th International Conference on Infrared, Millimeter and Terahertz Waves (IRMMW-THz), Conference Date Oct. 2-7, 2011, Houston, Texas, 2 pgs.

Bjarnason et al., "ErAs: GaAs photomixer with two-decade tunability and 12 μW peak output power", Appl. Phys. Lett., vol. 85, No. 18, Nov. 1, 2004, pp. 3983-3985.

Gregory et al., "Optimization of Photomixers and Antennas for Continuous-Wave Terahertz Emission", IEEE Journal of Quantum Electronics, vol. 41, No. 5, May 2005, pp. 717-728.

Heshmat et al., "Nanoplasmonic Terahertz Photoconductive Switch on GaAs", American Chemical Society, Nano Letters, Nov. 21, 2012, pp. 6255-6259.

Huo et al., "Planar Log-Periodic Antennas on Extended Hemispherical Silicon Lenses for Millimeter/Submillimeter Wave Detection Applications", International Journal of Infrared and Millimeter Waves, vol. 23, No. 6, Jun. 2002, pp. 819-839.

Liu et al., "Coherent Detection of Multiband Terahertz Radiation Using a Surface Plasmon-Polariton Based Photoconductive Antenna", IEEE Transactions on Terahertz Science and Technology, vol. 1, No. 2, Nov. 2011, Manuscript published Oct. 10, 2011, pp. 412-415.

Loata et al., "Radiation field screening in photoconductive antennae studied via pulse terahertz emission spectroscopy", Applied Physics Letters, 2007, vol. 91, p. 232506-1-232506-3.

Michael et al., "Large-area traveling-wave photonic mixers for increased continuous terahertz power", Appl. Phys. Letter 86, 111120, 2005, p. 111120-1-111120-3.

Okyay et al., "High Efficiency MSM Photodetectors on Heteroepitaxially Grown Ge on Si", Optics Letters, Sep. 1, 2006, vol. 31, No. 17, pp. 2565-2567, 2doi: 10.1364/OL.31.002565.

Park et al., "Enhancement of Terahertz Pulse Emission by Optical Nanoantenna", American Chemical Society, ACS Nano, No. 6, No. 3, 2012, published online Feb. 17, 2012, pp. 2026-2031.

Peytavit et al., "Milliwatt-level output power in the sub-terahertz range generated by photomixing in a GaAs photoconductor", Appl. Phys. Lett., 99, 223508, 2011, p. 223508-1-223508-3.

Roehle et al., "Next generation 1.5 μm terahertz antennas: mesa-structuring of InGaAs/InAlAs photoconductive layers", Optics Express, vol. 18, No. 3, Feb. 1, 2010, pp. 2296-2301.

Shen et al., "Properties of a one-dimensional metallophotonic crystal", Physical Review, 2004, vol. B70, p. 035101-1-038101-8.

Shibuya et al., "Enhancement of THz photomixing efficiency by using a pulse-modulated multimode laser diode", Infrared and Millimeter Waves, September 1, 20007, pp. 732-733.

(56) References Cited

OTHER PUBLICATIONS

Stevens et al., "Global health risks: progress and challenges", Bulletin of the World Health Organization, 2009, vol. 87, 3 pgs., doi: 10.2471/BLT.09.070565.

Sukhotin et al., "Photomixing and photoconductor measurements on ErAs/InGaAs at 1.55 μm", Appl. Phys. Lett., vol. 82, No. 18, May 5, 2003, pp. 3116-3118.

Suzuki et al., "Fe-implanted InGaAs terahertz emitters for 1.56 μm wavelength excitation", Appl. Phys. Lett. 86, 051104, 2005, p. 051104-1-051104-3.

Taylor et al., "Resonant-optical-cavity photoconductive switch with 0.5% conversion efficiency and 1.0 W peak power", Optics Letters, vol. 31, No. 11, Jun. 1, 2006, pp. 1729-1731.

Wang et al., "Plasmonic photoconductive detectors for enhanced terahertz detection sensitivity", Optical Society of America, Opt. Express, vol. 21, No. 14, Jul. 15, 2013, p. 17221-17227.

Williams et al., "Human aflatoxicosis in developing countries: a review of toxicology, exposure, potential health consequences, and interventions", The American Journal of Clinical Nutrition, 2004, vol. 80, No. 5, pp. 1106-1122, doi 10.1093/ajcn/80.5.1106.

World Health Organization, "IARC Monographs on the Evaluation of Carcinogenic Risks to Humans", 1999, vol. 71, Re-Evaluation of Some Organic Chemicals, Hydrazine and Hydrogen Peroxide, IARC Working Group on the Evaluation of Carcinogenic Risks to Humans, Feb. 14-24, 1998, 1597 pgs (presented in seven parts).

Yang et al., "Enhanced light-matter interaction at nanoscale by utilizing high-aspect-ratio metallic gratings", Optics Letters, vol. 38, No. 18, Sep. 15, 2013, pp. 3677-3679.

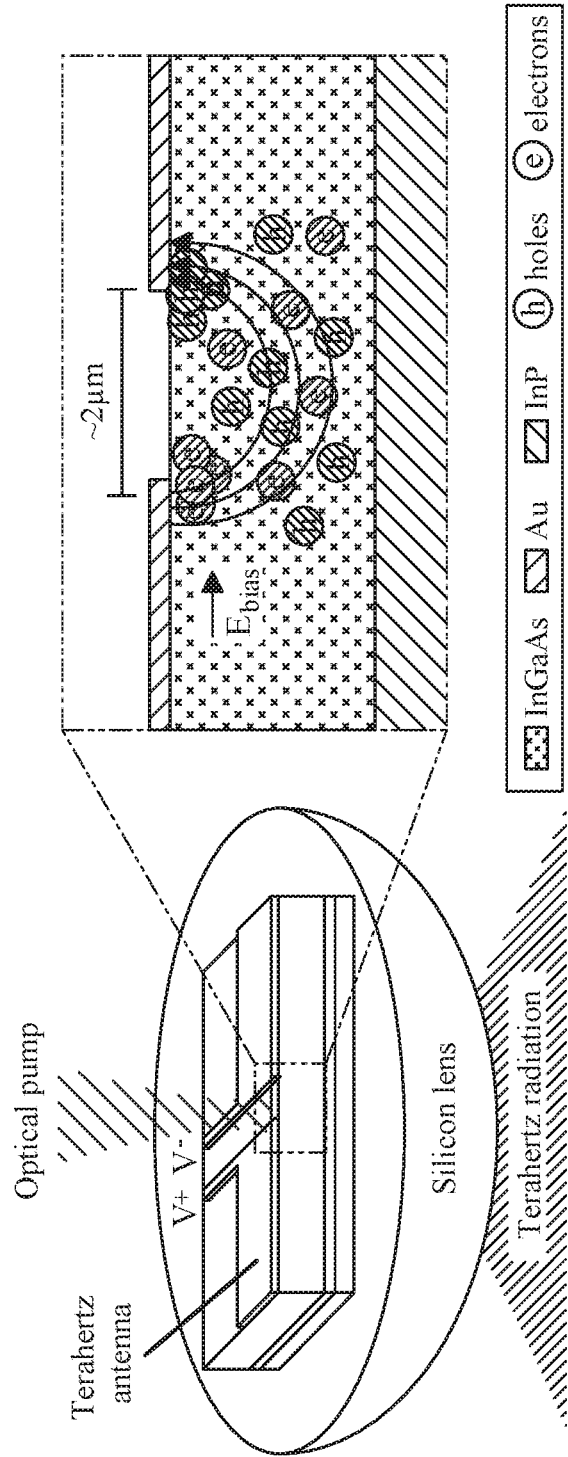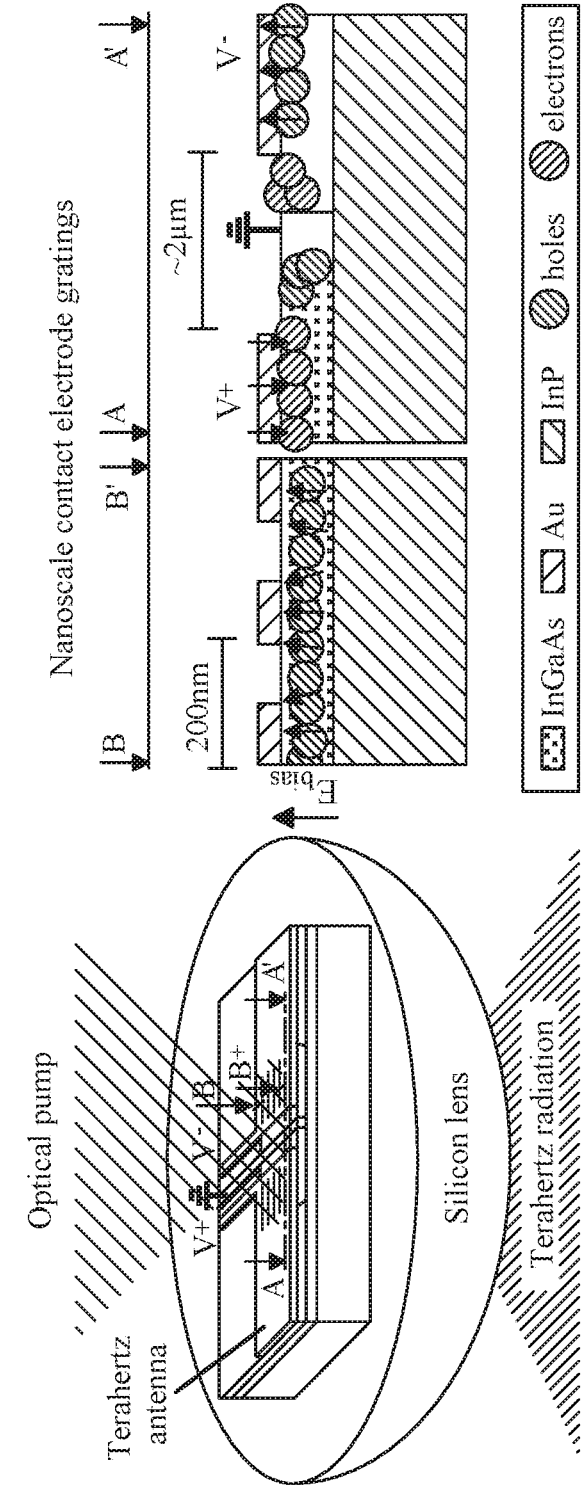

PHOTOCONDUCTIVE DETECTOR DEVICE WITH PLASMONIC ELECTRODES

CROSS-REFERENCE TO RELATED APPLICATIONS

The present application is a divisional of U.S. patent application Ser. No. 14/372,779, filed Jan. 23, 2013, and issued on Oct. 31, 2017 as U.S. Pat. No. 9,804,026 entitled, "Photoconductive Emitter Device with Plasmonic Electrodes" which is a 371 of International Application Serial No. PCT/US2013/022776, filed Jan. 23, 2013, entitled "Photoconductive Device with Plasmonic Electrodes", which claims priority under 35 U.S.C. § 119(e) to U.S. Provisional Application Serial No. 61/589,486, filed Jan. 23, 2012, entitled, "Photoconductive Source", the disclosures of each of the above list application and patens which are incorporated by reference herein in their entirety.

STATEMENT OF FEDERALLY-SPONSORED RESEARCH

This invention was made with government support under N66001-10-1-4027 awarded by Navy/SPAWAR, W911NF-12-1-0253 awarded by the Army Research Office, N00014-11-1-0856 awarded by the Office of Naval Research, EECCS1054454 Awarded by the National Science Foundation, N00014-11-1-0096 awarded by the Office of Naval Research. The government has certain rights in the invention.

TECHNICAL FIELD

This invention relates generally to photoconductive devices and, more particularly, to photoconductive devices that emit or detect terahertz (THz) waves using plasmonic electrodes for improved quantum efficiency.

BACKGROUND OF THE INVENTION

Terahertz (THz) waves possess a number of unique capabilities and properties, including ones that make them useful for chemical identification, material characterization, biological sensing, and medical imaging, to cite a few examples. Terahertz Time Domain Spectroscopy (THz-TDS) is a spectroscopic technique that uses very short pulses of THz radiation to probe or analyze different properties of a material and is sensitive to the material's effect on both the amplitude and phase of the THz radiation. Although there is much potential for the commercial use of THz-TDS systems, their use thus far has been somewhat hindered by certain drawbacks, such as their low power, inefficiency, high cost, thermal breakdown, complexity, and the bulky nature of existing terahertz sources.

For example, most existing terahertz (THz) spectrometers are not broadly used for military and commercial chemical detection and/or characterization purposes. This is mainly due to the drawbacks mentioned above which can hinder the practical feasibility of such systems, particularly in portable systems. Some research has been conducted in the areas of frequency domain terahertz spectrometers utilizing coherent terahertz sources, solid-state terahertz sources, quantum-cascade lasers (QCLs), and nonlinear optical techniques for down-conversion to terahertz frequencies, to name a few, however, each of these approaches has drawbacks of its own. Finding an approach that offers suitable output power and efficiency across a wide range of terahertz (THz) or nearby frequencies, yet does so in a relatively compact form and under normal operating conditions, can be challenging.

SUMMARY OF THE INVENTION

According to one aspect, there is provided a photoconductive device for emitting or detecting terahertz (THz) radiation. The photoconductive device may comprise: a semiconductor substrate; an antenna assembly fabricated on the semiconductor substrate; and a photoconductor assembly fabricated on the semiconductor substrate and coupled to the antenna assembly, the photoconductor assembly includes one or more plasmonic contact electrodes. The photoconductive device receives optical input from at least one optical source and uses the plasmonic contact electrodes to improve the quantum efficiency of the photoconductive device.

According to another aspect, there is provided a method of operating a photoconductive device that has a semiconductor substrate, an antenna assembly, and one or more plasmonic contact electrodes. The method may comprise the steps of: (a) receiving optical input from an optical source at the semiconductor substrate; (b) promoting the excitation of surface plasmon waves or surface waves with the plasmonic contact electrodes, wherein the surface plasmon waves or surface waves influence the optical input from the optical source so that a greater amount of optical input is absorbed by the semiconductor substrate and results in photocurrent in the semiconductor substrate; (c) applying a voltage to the antenna assembly so that a first portion of the photocurrent in the semiconductor substrate drifts toward a first antenna terminal and a second portion of the photocurrent in the semiconductor substrate drifts toward a second antenna terminal; and (d) emitting terahertz (THz) radiation from the photoconductive device in response to the first and second antenna terminals being supplied with the first and second portions of photocurrent.

According to another aspect, there is provided a method of operating a photoconductive device that has a semiconductor substrate, an antenna assembly, and one or more plasmonic contact electrodes. The method may comprise the steps of: (a) receiving optical input from an optical source at the semiconductor substrate; (b) promoting the excitation of surface plasmon waves or surface waves with the plasmonic contact electrodes, wherein the surface plasmon waves or surface waves influence the optical input from the optical source so that a greater amount of optical input is absorbed by the semiconductor substrate and results in photocurrent in the semiconductor substrate; (c) receiving incident terahertz radiation through the antenna assembly which induces a terahertz electric field across the plasmonic contact electrodes; and (d) drifting the photocurrent toward the plasmonic contact electrodes as a result of the induced terahertz electric field which generates an output photocurrent that is proportional to a magnitude of the incident terahertz radiation.

BRIEF DESCRIPTION OF THE DRAWINGS

Preferred exemplary embodiments will hereinafter be described in conjunction with the appended drawings, wherein like designations denote like elements, and wherein:

FIG. 7a shows two-dimensional plasmonic contact electrodes and FIGS. 7b-c show three-dimensional plasmonic contact electrodes;

DETAILED DESCRIPTION OF THE ILLUSTRATED EMBODIMENTS

Figure 1:
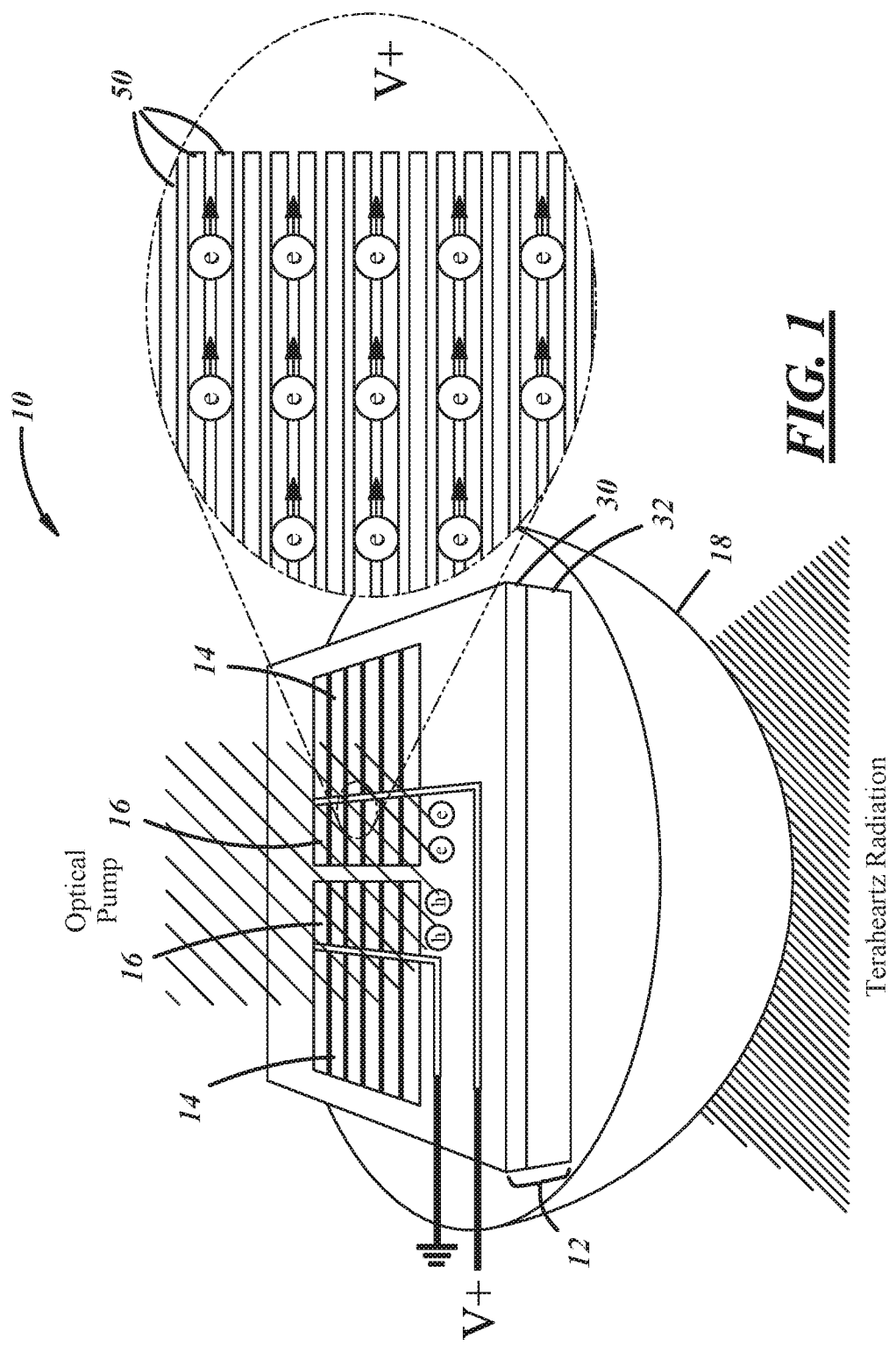
FIG. 1 shows an exemplary photoconductive device, where the particular photoconductive device shown here is arranged as a photoconductive source with a dipole antenna and has an enlarged section showing several plasmonic contact electrodes in more detail.

The photoconductive devices described herein address some of the performance limitations of existing photoconductive devices. According to an exemplary embodiment, the photoconductive device may be a high-performance plasmonic-distributed photoconductive terahertz source that is pumped at telecom pump wavelengths (e.g., 1.0-1.6 µm) for which high power, narrow linewidth, frequency tunable, compact and cost-efficient optical sources are available. A photoconductor assembly having a number of distributed plasmonic contact electrodes may significantly enhance the pump coupling efficiency, while enabling ultra high-speed collection of photo-generated carriers and mitigating the carrier screening effect and thermal breakdown limitations that can occur while operating at high pump power levels. This, in turn, may enable terahertz power levels that are significantly higher than those currently available. According to one exemplary implementation, the photoconductive device is a frequency tunable, compact and light-weight terahertz radiation source (pulsed or non-pulsed) that receives optical input from two commercially available laser diodes and an erbium-doped fiber amplifier that is capable of producing milliwatt-range power levels in the 1 THz frequency range. Such a high power and compact terahertz source could be beneficial for a number of potential applications, including next generation material, chemical and/or biological sensors. Although the following description is directed to a photoconductive source that emits terahertz radiation, it should be appreciated that the teachings are equally applicable to a photoconductive detector that receives terahertz radiation instead of emitting it. Thus, the term "photoconductive device," as used herein, includes both photoconductive sources and photoconductive detectors, and is not limited to one or the other.

The unique capabilities of material, chemical and/or biological sensors based on terahertz (THz) spectrometry offer an exceptional platform for standoff detection of many concealed toxic chemicals and gases, explosives, pathogens, chemical and biological agents. This is because many individual chemicals have their distinctive thermal emission peaks or their rotational or vibrational emission lines in the terahertz portion of the electromagnetic spectrum (e.g., 0.1-10 THz). Apart from potential security and military applications, terahertz spectrometers offer very promising platforms for environmental and space studies, biological analysis, pharmaceutical and industrial quality control, to cite a few possibilities. It should be appreciated that while the photoconductive device described herein is directed to use with terahertz (THz) radiation, it is not limited to such and may be used with electromagnetic radiation outside of the THz range (e.g., frequencies significantly higher than 10 THz and wavelengths significantly smaller than 1550 nm).

Some of the most powerful continuous wave (CW) terahertz sources to date have been molecular gas lasers, p-germanium lasers and free-electron lasers, which provide enough output power for most spectrometry systems, but can be bulky and expensive and generally are not suitable for portable systems. Additionally, electron beam devices such as backward-wave oscillators and travelling wave tube (TWT) regenerative amplifiers can offer reasonably high output power levels at sub-millimeter wave frequencies, but have not demonstrated efficient operation above about 1.2 THz and are not easily tunable. Some other conventional terahertz sources include IMPATT diodes, backward wave oscillators, Gunn diodes, frequency multipliers, and MMICs, while some more recent terahertz sources include photomixers, resonance tunneling diodes, traveling wave tubes, quantum cascade lasers, and sources based on non-linear optical effects, to name a few.

Turning now to FIG. 1, there is shown an exemplary embodiment of a photoconductive device 10 that is arranged as a photoconductive source or emitter and includes a semiconductor substrate 12, an antenna assembly 14, a photoconductor assembly 16, and a lens 18. Some potential, non-limiting features or attributes of photoconductive device 10 include: a photoconductor assembly 16 that uses plasmonic contact electrodes to enhance the quantum efficiency of the terahertz photoconductive device; a photoconductor assembly 16 that uses a distributed architecture to suppress thermal breakdown limitations and the carrier screening effect; antenna and photoconductor assemblies 14, 16 that enable a directional, high-intensity and steerable terahertz output; a photoconductive device 10 that is frequency tunable, compact and lightweight and is capable of producing radiation with an output power of at least 1 mW in a frequency range of 0.1-10 THz; and a semiconductor substrate 12 that includes a thin layer or film with relatively few defects acting as an efficient photo-conducting semiconductor at telecom wavelengths where high-power, tunable, narrow linewidth and compact lasers are available. Other features and attributes are certainly possible, as the aforementioned represent only some of the possibilities. Those skilled in the art will appreciate that a photomixer is a photoconductive device that is used to mix two optical beams; if the same device is illuminated with a single beam it would not generally be a photomixer. Photoconductive device 10 may be used as a photomixer (two beams) or as a pulsed terahertz source (one beam), to cite two possibilities.

As mentioned before, one of the main quantum efficiency limitations of existing photoconductors is the low thermal conductivity of the semiconductor substrates, which can lead to premature thermal breakdown at high optical pump power levels. Low thermal conductivity can become more problematic in some high defect materials where the photon mean-free-path is dramatically reduced by the introduced defects. Photoconductive device 10 aims to mitigate the quantum efficiency limitations of certain conventional devices that are based on short carrier lifetime semiconductors by using a photoconductor assembly 16 with plasmonic contact electrodes that are distributed on a semiconductor substrate 12 having a low defect layer or film. The plasmonic contact electrodes may suppress the carrier screening effect and thermal effects by spreading high-power optical input across an arbitrarily large two-dimensional array of electrodes that are adjacent the various elements of antenna assembly 14; this, in turn, distributes the capacitive load across the antenna and photoconductor assemblies 14 and 16. The plasmonic contact electrodes may also be configured in a periodic arrangement with sub-wavelength spacing (e.g., 100 nm spacing for a pump wavelength of 1 µm) in order to maintain high quantum efficiency and ultrafast response by enhancing the optical transmissivity into the semiconductor substrate and absorption in close proximity with the plasmonic contact electrodes.

Semiconductor Substrate—

Semiconductor substrate 12 acts as a photoconductive material that can generate electron-hole pairs in response to optical input from one or more optical sources, such as an ultrafast pulsed lasers or two heterodyning continuous-wave lasers used in the telecom industry. According to an exemplary embodiment, semiconductor substrate 12 includes a thin top layer or film 30 (e.g., a thin layer around 1 µm thick) that acts as the device active layer, and a thicker bottom layer 32 that acts as a base layer on which the top layer can be grown or deposited. In one potential embodiment, thin top layer 30 is made from germanium (Ge) and thicker bottom layer 32 is made from silicon (Si); in another potential embodiment, thin top layer 30 is made from indium gallium arsenide (InGaAs) or gallium arsenide (GaAs) and thicker bottom layer 32 is made from indium phosphate (InP). Other materials and semiconductor substrate arrangements and layer combinations are certainly possible, including any suitable combination or use of sapphire; silicon (Si); germanium (Ge); silicon germanium (SiGe); various indium gallium arsenide compounds (InGaAs) including those that are crystalline, low-temperature-grown, ion-implanted and erbium arsenide doped; various gallium arsenide compounds (GaAs) including those that are crystalline, low-temperature-grown, ion-implanted, erbium arsenide doped; various indium gallium nitride compounds (InGaN); indium phosphide (InP); and Graphene, to cite a few of the possibilities.

Figure 2:
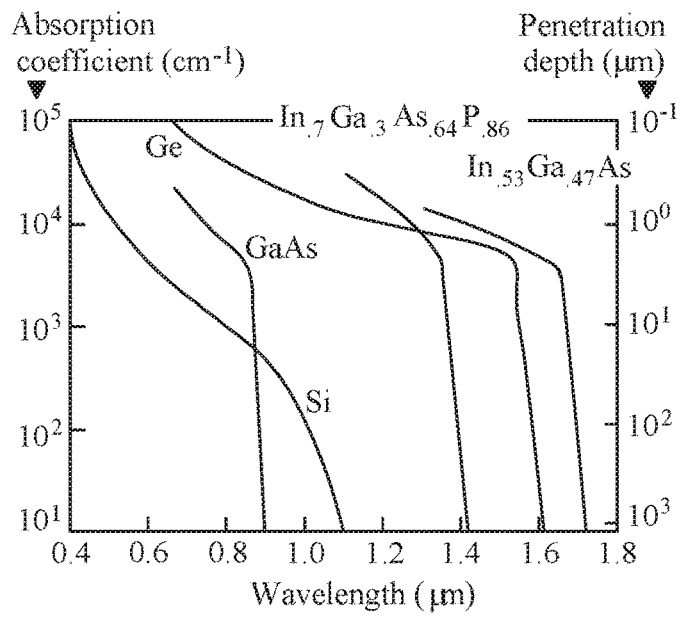
FIGS. 2-3b are different graphs showing certain properties of exemplary semiconductor substrate materials.

It should be mentioned that the photoconductive device with plasmonic contact electrodes disclosed herein provides for high quantum efficiency and ultrafast operation simultaneously, and thus enables the use of many semiconductor materials that could not be used in previous photoconductive devices (e.g., germanium (Ge), Graphene, and indium gallium nitride compounds (InGaN)). One potential advantage of germanium (Ge) is the higher thermal conductivity it offers compared with other materials, while offering high absorption coefficients at telecommunication optical wavelengths. As illustrated in FIG. 2, bulk-Ge and some of the InGaAs-based compounds (e.g., In0.53Ga0.47As) offer much higher absorption coefficients at standard telecom wavelengths, compared to other semiconductors which are traditionally used for photo-absorption. Additionally, it has been shown that adding strain to Ge films can push the absorption band edge to even longer wavelengths and increase the absorption coefficient significantly at the standard telecom wavelength range (~1.55 µm). A potential advantage of using indium gallium nitride compounds (InGaN) relates to power handling advantages for device operation at high power levels. Also, Graphene may offer extremely fast carrier transport speeds, further enhancing the device quantum efficiency while operating at ultrafast speeds. It should be recognized, however, that the photoconductive device 10 described herein may use any number of suitable semiconductor materials, including low-defect or high-defect materials, and is not limited to any of the exemplary materials provided above.

Addressing the thermal limitations which can limit the maximum output power of a photoconductive device can be helpful for developing a suitable, high-power terahertz source. In the absence of such thermal limitations, photoconductor terahertz output power scales quadratically with the pump power level, which shows great potential for achieving very high terahertz power levels. According to previous studies, the thermal conductivity of bulk Ge and $In_{0.53}Ga_{0.47}As$ are measured to be about 0.58 W cm$^{-1\circ}$ C.$^{-1}$ and 0.05 W cm$^{-1\circ}$ C.$^{-1}$, respectively. Although not necessary, it is preferable that the thin top layer 30 of the semiconductor substrate 12 have a thermal conductivity that is equal to or greater than 0.1 W cm$^{-1\circ}$ C.$^{-1}$. The introduction of defects might affect the thermal conductivity of the grown crystalline film, particularly introduced defects that appear at the multi-layer interface and can potentially reduce the thermal conductivity by reducing phonon mean free-path. Accordingly, it is preferable that thin top layer 30 be a low-doped, low-defect layer with as high of thermal conductivity as possible (this is not absolutely necessary, however, as the thin top layer may sometimes be comprised of high-defect, short carrier lifetime materials instead).

Another potentially attractive feature of a thin top layer 30 made from germanium (Ge) is its compatibility with a thicker bottom layer 32 made from silicon (Si) layer, as well as process compatibility with silicon (Si) processes (e.g., low temperature processing capability). In some instances, this may be a significant capability because it allows growing thin layers of germanium (Ge) active areas on a high resistivity silicon (Si) substrate, which is known to introduce minimal propagation loss at terahertz wavelengths. The exemplary semiconductor substrate embodiment with its germanium (Ge) and silicon (Si) layers may take advantage of existing epitaxial growth techniques for growing high quality Ge layers on Si.

Figure 3A:
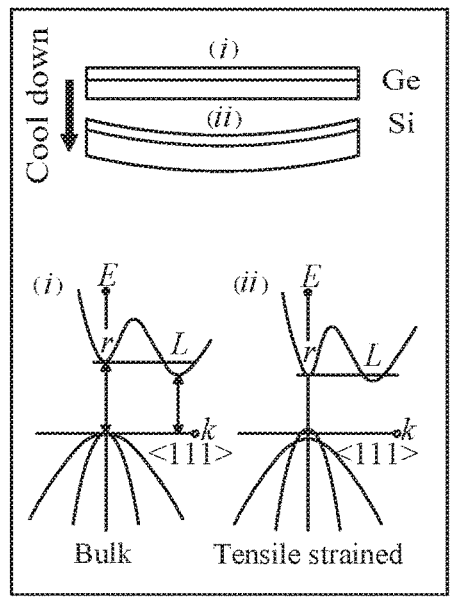
Figure 3B:
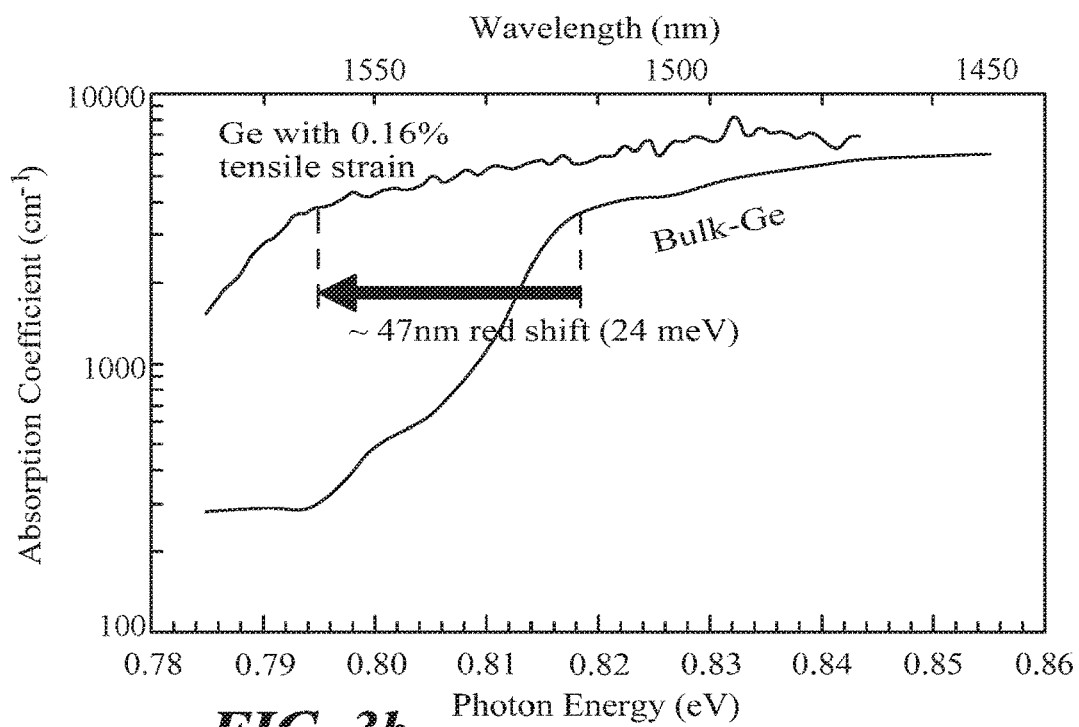

The exemplary semiconductor substrate 12 can have a thin layer of Ge film that is grown on high resistivity Si. One potential technique for accomplishing this includes multiple steps of growth and annealing in a hydrogen ambient to grow high quality germanium (Ge) on silicon (Si) with low threading dislocation density, as is known in the art. In this technique, a thin Ge film is grown heteroepitaxially on Si and in-situ annealed at a higher temperature in an $H_2$ ambient which can reduce the surface roughness by 90% and facilitates stress relief in the first few hundred angstroms. Subsequent Ge growth is homoepitaxy on a virtual Ge lattice with no additional defects forming, where the grown film takes the crystal lattice of the underlying substrate. A potential advantage of the employed Ge growth technique is that the resulting strained-Ge film can offer an order of magnitude higher absorption coefficient at telecom wavelengths (e.g., about 1550 nm wavelength), compared to bulk Ge. This is due to a germanium (Ge) absorption spectrum red shift (illustrated in FIG. 3b), as a result of tensile strain introduced by the thermal expansion coefficient mismatch between Si and Ge (shown in FIG. 3a). FIG. 3b illustrates Ge absorption spectrum red shift due to tensile strain and, more specifically, experimental absorption coefficient vs. photon energy of a Ge layer grown with an estimated tensile strain of 0.16%, showing a 47 nm red shift of the absorption edge due to tensile strain. FIG. 3a shows the change in the bands with biaxial tensile strain in the Ge film. For more information on the graphs illustrated in FIGS. 3a-b, please refer to A. K. Okyay, A. Nayfeh, T. Yonehara, A. Marshall, P. C. McIntyre, K. C. Saraswat, "*High Efficiency MSM Photodetectors on Heteroepitaxially Grown Ge on Si,*" Opt. Lett., 31, pp. 2565-2567, 2006. The minimum of the conduction band at the zone center moves down while the maximum of the valence band for heavy and light holes move up. The direct band energy is reduced due to tensile strain. In the case of an indium gallium arsenide (InGaAs) compound, the thin layer can be epitaxially grown on an Indium aluminum Arsenide (InAlAs) buffer layer on a semi-insulation Indium Phosphide (InP) substrate. Some of the above-listed fabrication techniques are known and understood by those skilled in the art.

Antenna Assembly—

Figure 4:
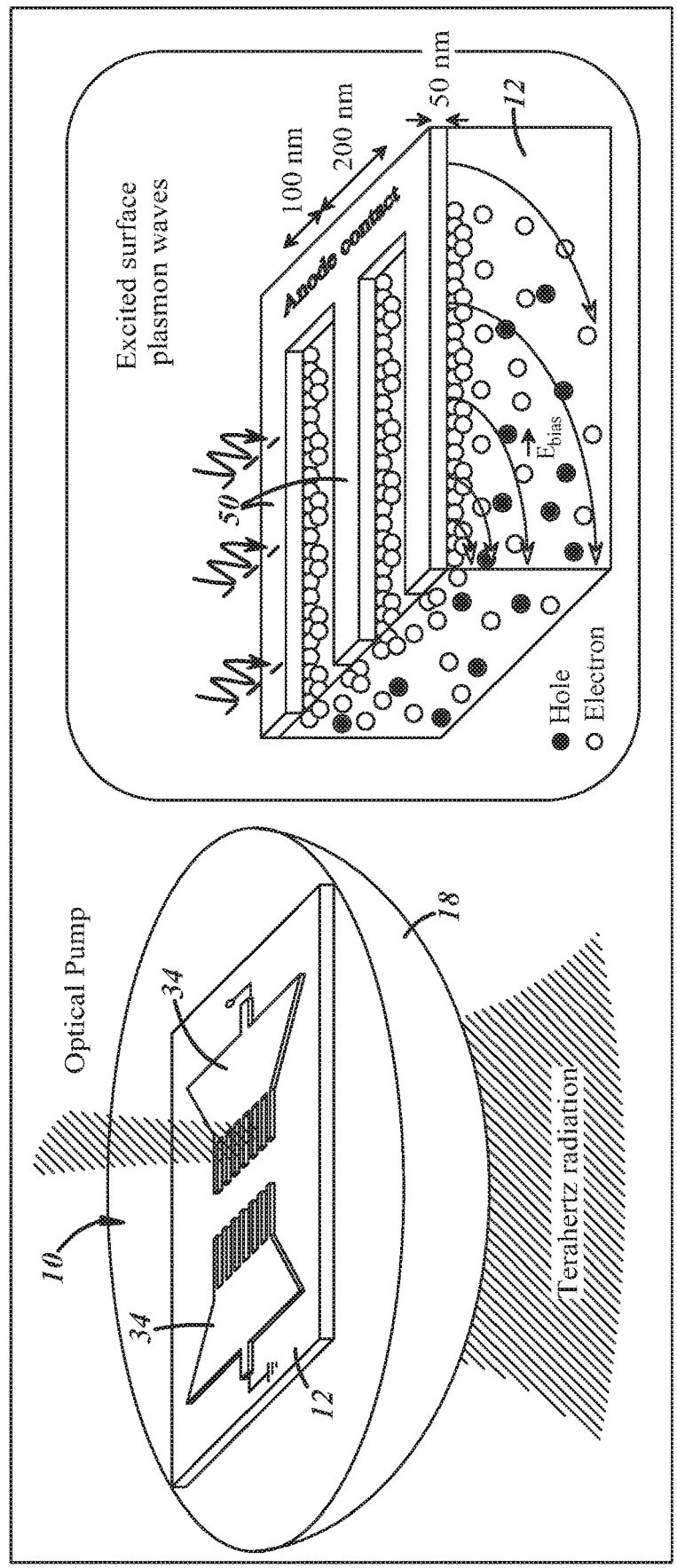
FIG. 4 shows another exemplary photoconductive device, where the particular photoconductive device shown here is arranged as a photoconductive source with a bowtie antenna and has an enlarged section showing several plasmonic contact electrodes in more detail.

Antenna assembly 14 is fabricated on semiconductor substrate 12 and is used to emit terahertz (THz) radiation (photoconductive source) or to detect THz radiation (photoconductive detector). Those skilled in the art will appreciate that any number of different photoconductive THz antenna configurations and arrangements may be used with the photoconductive device described herein and that it is not limited to any one particular embodiment. For example, antenna assembly 14 may be a monopole antenna, butterfly antenna, a dipole antenna, a spiral-type antenna, a folded dipole antenna, a log-periodic antenna, a bow tie-type antenna, or any other suitable photoconductive THz antenna configuration that is known in the art. In FIG. 1, antenna assembly 14 is schematically shown as a dipole antenna, while FIG. 4 schematically shows a different embodiment of the photoconductive device 10 using a bow tie-type antenna assembly 34, instead of a dipole-type antenna. In both of these embodiments, the antenna assemblies use a number of plasmonic contact electrodes to improve the performance of the devices, as described below in further detail.

In order to implement photoconductive device 10 as a photoconductive terahertz (THz) source, the photoconductor assembly 16 is integrated with a THz antenna. Since the amplitude of the photo-generated current fed to the antenna is linearly proportional to the photoconductor active area, an array of closely spaced dipole antennas may be designed to increase the photoconductive area while maintaining a small RC time-constant and high radiation resistance. ADS and HFSS software packages can be used to optimize, for example, an antenna array structure for maximum radiation power, by combining the antenna radiation parameters, photoconductor parasitics, and the amount of injected current based on photoconductor active area.

The output power of the photoconductive device 10 can be further enhanced through use of resonant cavities, antennas with higher radiation resistance and bandwidth, antenna arrays, and through the use of appropriate impedance matching techniques. For example, any of the techniques, features, embodiments, etc. disclosed in C. W. Berry, M. Jarrahi, "*Principals of Impedance Matching in Photoconductive Antennas,*" Journal of Infrared, Millimeter and Terahertz Waves, 33, 1182-1189, 2012, the entire contents of which are incorporated herein by reference, may be used with the exemplary photoconductive device disclosed herein.

Photoconductor Assembly—

Photoconductor assembly 16 is also fabricated on semiconductor substrate 12 and is designed to improve the quantum efficiency of the photoconductive device 10 by plasmonically enhancing the pump absorption into the photo-absorbing regions (e.g., layer 30) of semiconductor substrate 12. According to an exemplary embodiment, photoconductor assembly 16 includes a number of plasmonic contact electrodes 50 that are arranged in arrays in order to enhance the optical-to-terahertz conversion efficiency in the photoconductive source 10. "Plasmonic contact electrode," as used herein, broadly refers to any electrode structure that is part of or is coupled to a photoconductor assembly and excites or otherwise promotes surface plasmon waves or surface waves which enhance light coupling to sub-wavelength device active regions determined by the electrodes, as described below in more detail. In one embodiment, the plasmonic electrodes 50 include a number of thin finger-like electrodes that are arranged in parallel and are fabricated on the top layer 30 of the semiconductor substrate 12 so that sub-wavelength metallic apertures are formed there between. Plasmonic enhancement is achieved by configuring the closely spaced plasmonic contact electrodes 50 in a periodic arrangement with nano-scale electrode width and electrode spacing (e.g., less than about 200 nm), which allows ultrafast collection of the photo-generated carriers and results in higher quantum efficiency compared with previous photoconductors. The plasmonic contact electrodes 50 may be integrally formed with the antenna assembly 14 such that they extend therefrom, or they may be a separate array or other structure that is formed separate and is then connected to the antenna assembly. Some non-limiting examples of suitable plasmonic contact electrode metals include gold (Au), silver (Ag), titanium (Ti), nickel (Ni), and various alloys thereof.

Skilled artisans will appreciate that optical absorption into sub-wavelength contact electrode apertures or gaps is typically severely limited by the diffraction limit. However, photoconductor assembly 16 with its periodic arrangement of plasmonic contact electrodes 50 circumvents the diffraction limit by configuring sub-wavelength contact electrodes in a way that is capable of exciting surface plasmon waves. Excitation of surface plasmon waves allows bending of the electric field lines of the incident optical beam on top of the periodically arranged plasmonic contact electrodes 50, which in turn prevents the incident optical excitation from being blocked by electrodes 50. This can be of some significance, especially for certain embodiments where a significant portion of the device active area is covered by plasmonic contact electrodes 50. Plasmonic electrodes with metallic apertures or slits may be implemented in broadband terahertz spatial beam modulators, and plasmonically-enhanced localization of light into photoconductive antennas which enhance the efficiency/bandwidth product of photoconductive antennas, are also possibilities.

As explained more in the following sections, incorporating plasmonic contact electrodes 50 in a photoconductor assembly 16 can overcome certain diffraction limitations, which can significantly reduce the transmission of an optical beam through contact electrodes with sub-wavelength spacing. As a result, ultrafast transport of photo-generated carriers will not pose a significant limitation on quantum efficiency. One of the challenges of device designs with a narrow band-gap semiconductor, such as Ge, is the high dark current. The high dark current challenge can be addressed by using asymmetric plasmonic contact electrodes, considering the plasmonic contact metal, feature size, and shape.

A schematic representation of excited surface plasmon waves is shown in the enlarged inset of FIG. 4. The electrode grating geometry is designed to excite surface plasmon waves along the periodic metallic grating interface upon incidence of a TM-polarized optical pump. Excitation of surface plasmon waves allows transmission of a large portion of the optical pump through the nanoscale grating into the photo-absorbing semiconductor substrate 12. It also enhances the intensity of the optical pump in very close proximity to the plasmonic contact electrodes 50. As a result, the average photo-generated electron transport path length to the anode electrode or terminal of the antenna assembly 14 is significantly reduced in comparison with conventional photoconductive emitters. Therefore, it is desirable for the photoconductor assembly 16 to optimize the optical pump transmission into the photo-absorbing semiconductor substrate 12 while minimizing the electrode spacing to minimize the average photo-generated electron transport path length to the anode electrode.

Figure 5:
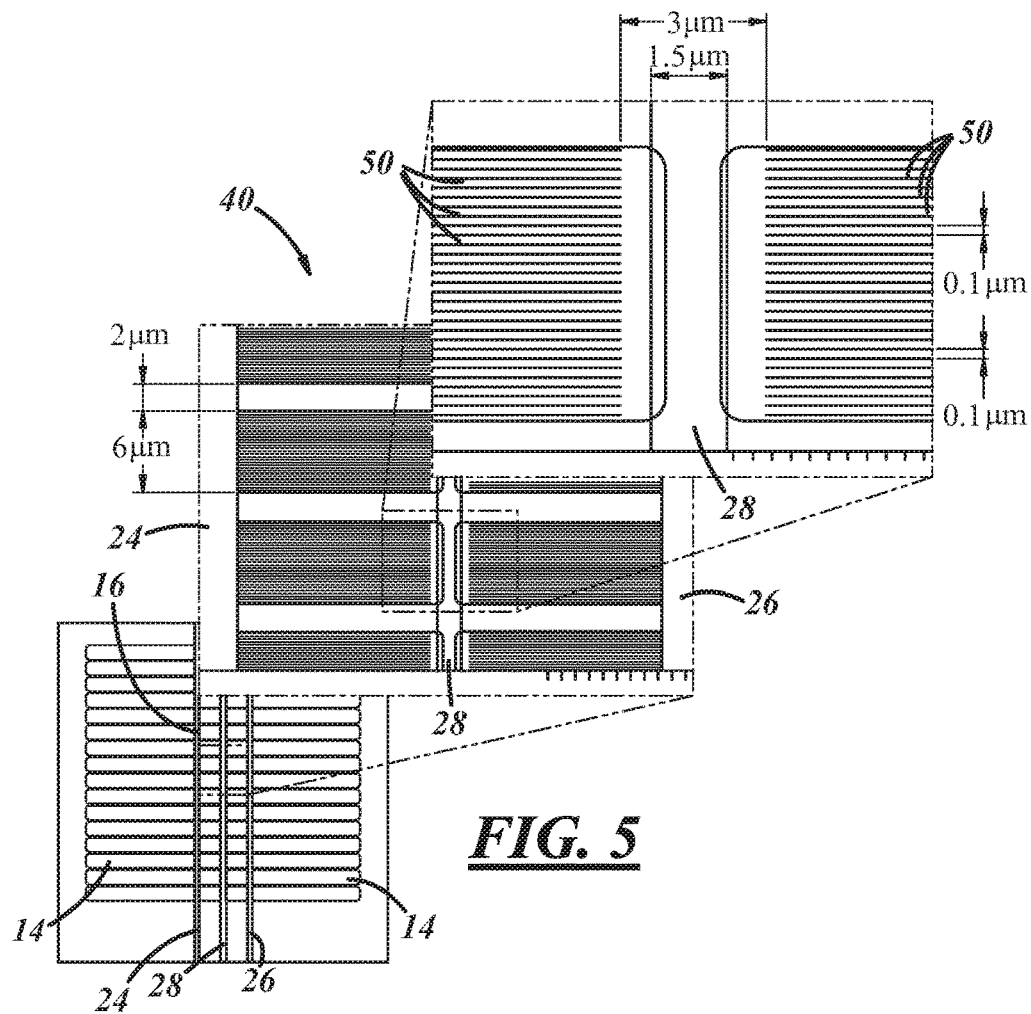
FIG. 5 shows exemplary antenna and photoconductor assemblies that may be used with a photoconductive device, such as the one in FIG. 1, and has enlarged sections showing plasmonic contact electrode arrays in more detail.

With reference now to FIG. 5, there are shown antenna and photoconductor assemblies 14 and 16 where several enlarged insets illustrate plasmonic contact electrode arrays in more detail. As demonstrated, approximately half of the plasmonic contact electrodes 50 are electrically coupled to a first antenna terminal 24 and provide that terminal with photo-generated carriers, while the other half of the plasmonic contact electrodes 50 are electrically coupled to and provide a second antenna terminal 26 with photo-generated carriers. An elongated separating member 28, which is an optional component, separates or partitions the two groups of plasmonic electrodes 50. One half of the plasmonic contact electrodes is collecting positive carriers and the other half is collecting negative carriers. Although the spacing and configuration may vary from that shown in FIG. 5 by way of example, the spacing between the plasmonic contact electrodes can be of some importance. If, for example, the plasmonic contact electrodes that are connected to antenna terminal 24 are too close to those connected to antenna terminal 26, there could be capacitance-related issues or it could prevent the high-enough electric field levels required for ultrafast drift of the photocarriers to the plasmonic contact electrodes along the entire plasmonic contact electrode area. Furthermore, even though the photoconductor assembly 16 is shown to be partitioned or arranged in segments or clusters of plasmonic contact electrodes with spacing in between, this is not necessary.

Figure 6:
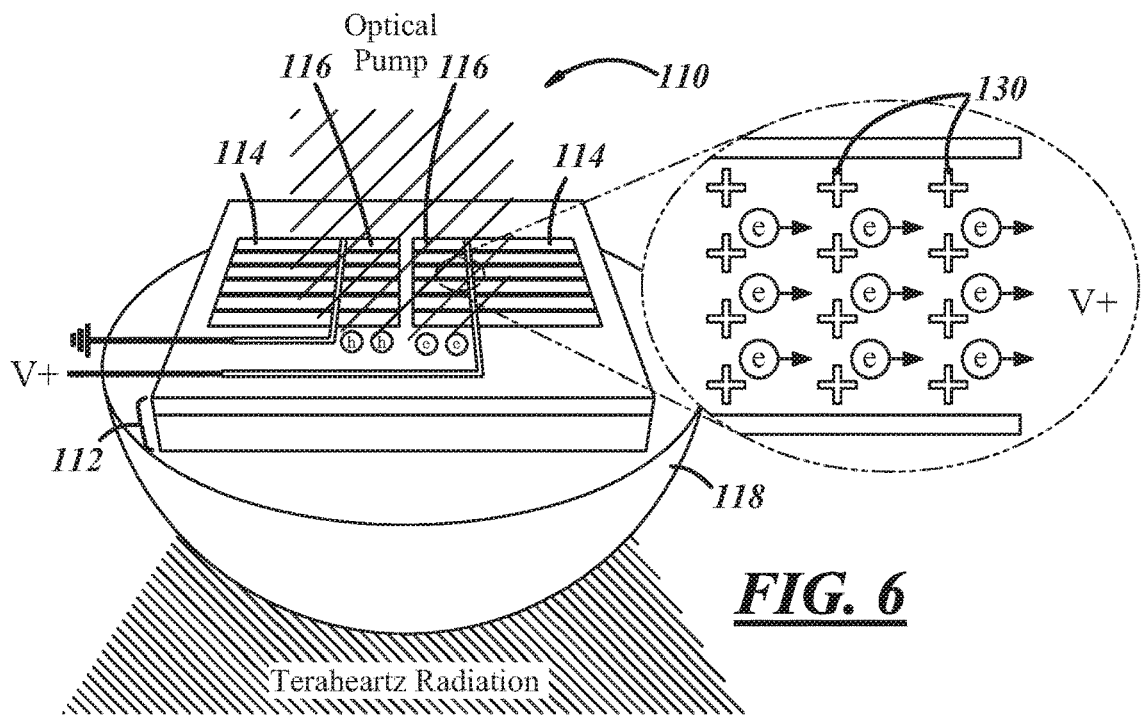
FIG. 6 shows another exemplary photoconductive device, where the particular photoconductive device shown here is arranged as a photoconductive source with a dipole antenna and has an enlarged section showing several cross-shaped plasmonic contact electrodes in more detail.

FIG. 6 shows another potential embodiment of the photoconductive source, with a somewhat different photoconductor assembly design. Photoconductive device 110 includes a semiconductor substrate 112, antenna assembly 114, photoconductor assembly 116, and a lens 118 and is similar to the embodiment illustrated in FIG. 1, except that the photoconductor assembly includes a number of cross-shaped plasmonic contact electrodes 130. Photoconductor assembly 116, as well as the other photoconductor assemblies disclosed herein, may function as a plasmonic aperture and can be a two-dimensional array of nano-scale apertures of various geometries and configurations, such as those having the following shapes: a grating, a rectangular-shape, a cross-shape, a C-shape, a H-shape, a split-ring-resonator, a circular hole, or a rectangular hole (the ones shown in FIG. 6 being cross-shaped).

The use of high aspect ratio plasmonic contact electrodes embedded inside the photo-absorbing semiconductor allows a larger number of carriers generated in close proximity with photoconductor contact electrodes and, thus, enables further terahertz radiation enhancement. In this regard, extending the plasmonic electrode height to dimensions larger than the optical pump absorption depth allows ultrafast transport of the majority of photocarriers to the photoconductor contact electrodes and their efficient contribution to terahertz generation. This may eliminate the need for using short carrier lifetime semiconductors, which may be used for suppressing the DC current of photoconductive emitters and for preventing undesired destructive interferences in continuous-wave photoconductive emitters. Eliminating the need for using short carrier lifetime semiconductors, which have lower carrier mobilities and thermal conductivities compared to high quality crystalline semiconductors, could have an important impact on future high power and high efficiency photoconductive terahertz emitters. It could also lead to a new generation of photoconductive terahertz emitters based on photo-absorbing semiconductors with unique functionalities (e.g., Graphene-based photoconductive emitters that benefit from superior carrier mobilities or GaN-based photoconductive emitters that benefit from superior thermal conductivity).

Figure 7A:
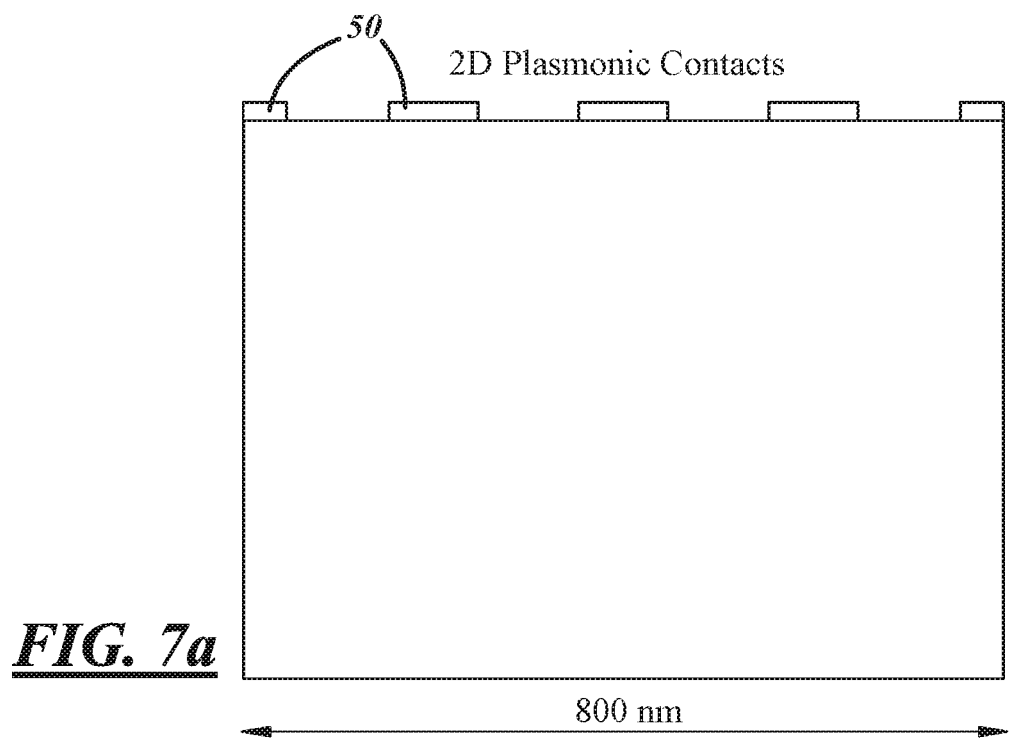
FIGS. 7a-c show exemplary plasmonic contact electrodes that may be used with a photoconductive device, such as the one in FIG. 1, where
Figure 7B:
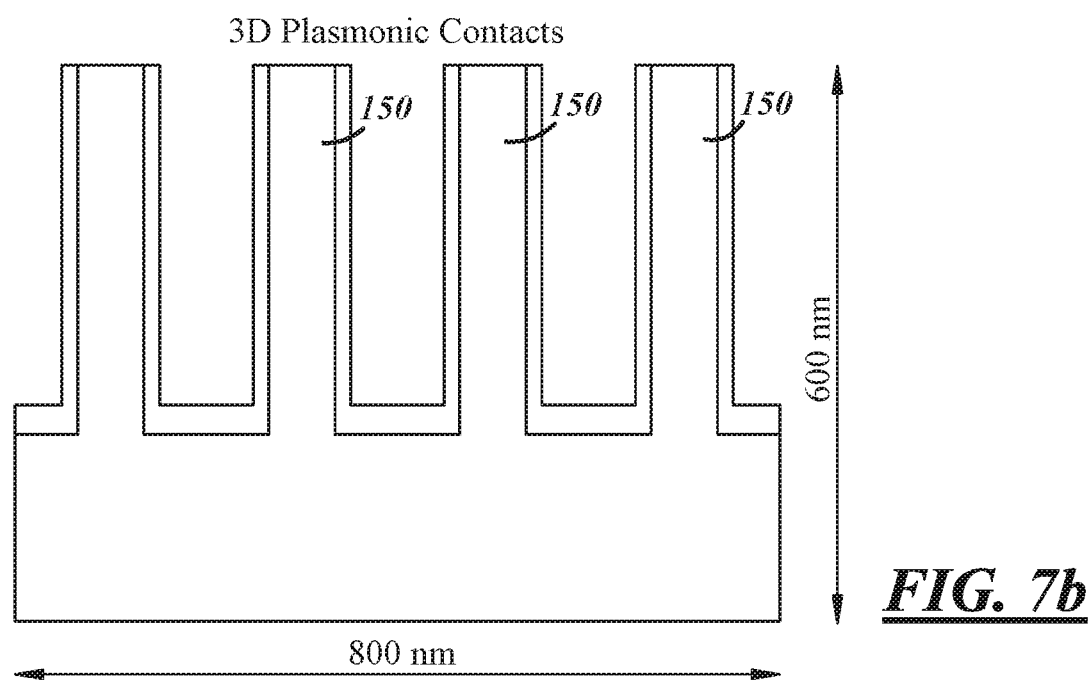
Figure 7C:
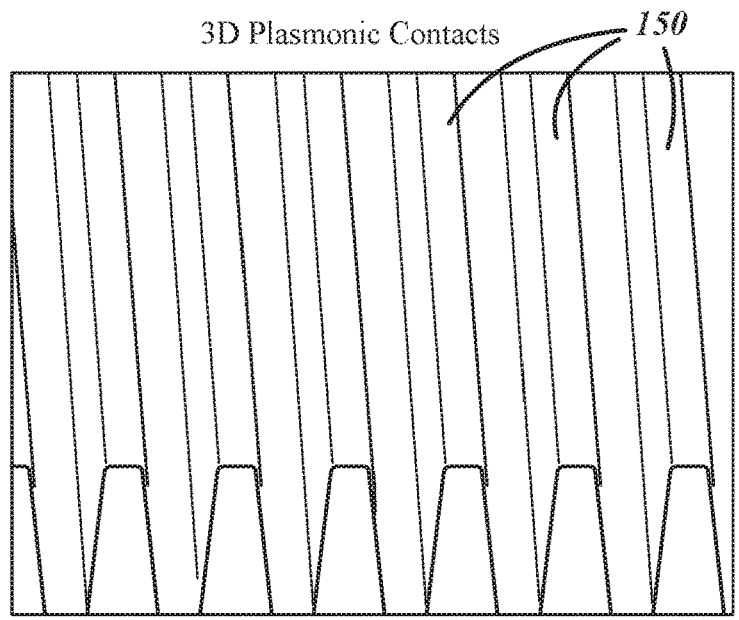

FIG. 7a shows a photoconductor assembly with a number of two-dimensional plasmonic contact electrodes 50, as described above, while FIGS. 7b-c show a photoconductor assembly having a number of three-dimensional plasmonic electrodes 150. "Two-dimensional plasmonic contact electrodes," as used herein, generally refer to plasmonic electrodes that are very thin, thus, they have a small height dimension relative to their width or length dimensions (see example schematically represented in FIG. 7a). "Three-dimensional plasmonic contact electrodes," as used herein, generally refer to plasmonic electrodes that are much thicker and have a larger height dimension when compared to their width or length dimensions (see example schematically represented in FIG. 7b). Three-dimensional plasmonic contact electrodes extend away from the surface of the semiconductor substrate by a more significant amount than two-dimensional electrodes and are sometimes described as having a high aspect ratio. These plasmonic contact electrode arrangements have resulted in one or more orders of magnitude of terahertz radiation enhancement compared with conventional designs. Some estimates were made regarding the impulse response and responsivity of the analyzed photoconductors with the illustrated two- and three-dimensional plasmonic contact electrodes by combining the photogenerated carrier density in a photo-absorbing substrate, the electric field data, and the classical drift-diffusion model in a multi-physics finite-element solver (COMSOL) and calculating the induced photocurrent in response to an optical pump impulse. These estimates indicate more than one order of magnitude terahertz power enhancement for a photoconductive THz emitter with three-dimensional plasmonic contact electrodes (FIGS. 7b-c) in comparison with a similar photoconductive device having two-dimensional plasmonic contact electrodes (FIG. 7a). Therefore, a photoconductive terahertz emitter with the three-dimensional plasmonic contact electrodes 150 may offer more than three orders of magnitude higher terahertz radiation compared with a conventional photoconductive terahertz emitter lacking plasmonic contact electrodes, when compared under the same operation conditions.

Other photoconductor assembly and plasmonic contact electrode embodiments may also be used with the photoconductive device 10 disclosed herein, as the preceding examples are simply meant to illustrate some of the possibilities.

Other Components, Arrangements, Features, Etc.—

It is possible for photoconductive device 10 to include a variety of other optical and non-optical components in order to improve the performance, operation, etc. of the device. For example, in order to achieve higher quantum efficiencies and terahertz powers, specifically designed optical diffusers, one-dimensional or two-dimensional lens arrays can be used to guide the optical input or pump beam so that it is only incident on the active areas of the photoconductor assembly 16 and is not wasted on the rest of the device area that does not contribute to THz radiation, while employing large arrays of photoconductive devices.

Figure 8:
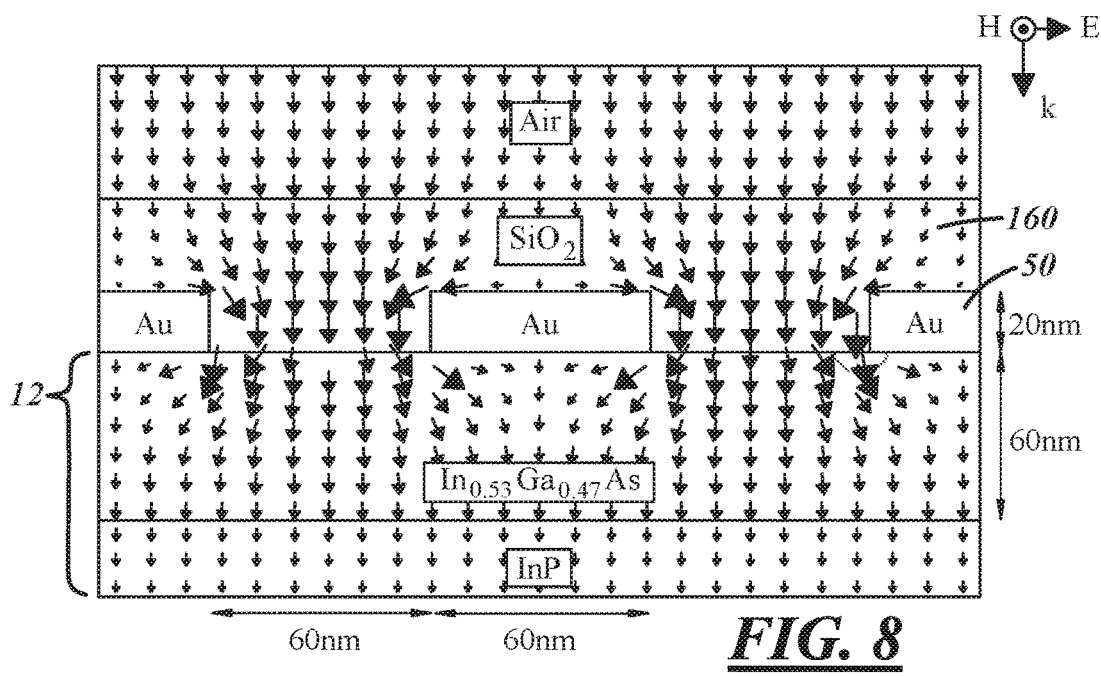
FIG. 8 shows a schematic cross-section of a portion of an exemplary photoconductive device, such as the one in FIG. 1, where the device further includes a passivation layer on top of the semiconductor substrate.

Another potential feature that may be used is a dielectric passivation layer that can reduce the Fresnel reflection at the semiconductor interface and, thus, enhance optical pump transmission into the photo-absorbing semiconductor substrate. While optical pump transmission into the photo-absorbing semiconductor of a conventional photoconductor is the result of direct interaction between the pump wave and the semiconductor interface, optical pump transmission into the photo-absorbing semiconductor of a photoconductor having plasmonic electrodes, such as the one described herein, involves coupling to the excited surface plasmon waves. In the case of a plasmonic photoconductor, passivation layer thickness can be optimized to achieve up to 100% optical transmission into the photo-absorbing semiconductor. One non-limiting example of a suitable passivation layer 160 is shown in FIG. 8, where a $SiO_2$ passivation layer (e.g., 150 nm thick) is used with the present photoconductor having plasmonic contact electrodes. It is possible for the passivation layer 160 to completely encapsulate the plasmonic electrodes 50 (as shown in the drawing), or for the passivation layer to just cover the top surface of the semiconductor substrate 12 so that the plasmonic contact electrodes 50 extend through the passivation layer. The passivation layer 160 may include number of suitable materials other than $SiO_2$, such as SiN or $Si_3N_4$, for example.

A low resistivity bias network may also be used in conjunction with the proposed photoconductive device 10. Such a bias network can be especially useful when using low bandgap energy semiconductors (e.g. Ge, InGaAs), which have a relatively high dark current.

As mentioned above, the photoconductive device 10 may also be used as a photoconductive terahertz detector as well. Similar to photoconductive terahertz emitters, a primary limitation of conventional photoconductive terahertz detectors is their low responsivity and sensitivity, which is typically the result of the inherent tradeoff between high quantum efficiency and ultrafast operation of conventional photoconductors. Another potential advantage of the plasmonic contact electrode structures described herein is that they offer significantly higher responsivities and detection sensitivities compared to conventional photoconductive terahertz detectors by reducing the photo-generated carrier transport path to the photoconductor contact electrodes. Moreover, the device active area can be increased without a significant increase in the photoconductor capacitive parasitic and, therefore, higher detector responsivity levels can be achieved at higher optical pump power levels. Performance of photoconductive terahertz detector prototypes is characterized in a time-domain terahertz spectroscopy setup. Some experimental results show that incorporating plasmonic contact electrodes may enhance the detector responsivity by more than one order of magnitude.

Operation—

Operation of the photoconductive source 10 is based on an incident optical pump generating electron-hole pairs in the photo-absorbing semiconductor substrate 12. An applied voltage across the photoconductor assembly 16 drifts the generated carriers toward their corresponding plasmonic contact electrodes 50. The collected photo-current at the plasmonic contact electrodes 50 drives the terahertz antenna assembly 14, which is connected to or otherwise integrated with the photoconductor assembly 16. The generated photo-current follows the waveform of the optical pump, thus, by using a sub-picosecond optical pulse or heterodyning two continuous-wave optical beams with a terahertz frequency difference, a pulsed or continuous-wave terahertz current is coupled to the terahertz antenna assembly 14, respectively. In order to operate efficiently at the desired terahertz frequency range, the transport time of the photo-generated carriers to the plasmonic contact electrodes 50 should be a fraction of the terahertz oscillation period.

The photoconductive source 10 may exhibit a sub-picosecond response time and can be fabricated on a high quality crystalline semiconductor substrate 12 with a large carrier lifetime or a short-carrier lifetime semiconductor substrate. The ultrafast response of the photoconductive source 10 is due to excitation of surface plasmon waves which concentrate a major portion of the incident light in close proximity with the plasmonic contact electrodes 50 of the photoconductor assembly 16 and, thus, enables ultrafast collection of photo-generated carriers without sacrificing the photoconductor quantum efficiency significantly. In one embodiment, the ultrafast photoconductive source 10 includes a photo-absorbing semiconductor substrate 12 made from a high-quality crystalline semiconductor and a photoconductor assembly 16 having a plasmonic contact electrode grating. The grating periodicity or pitch and the electrode spacing or aperture size are significantly smaller than the wavelength of the incident optical beam. Therefore, surface plasmon waves can be excited at the metallic grating surface. Excitation of surface plasmon waves assists with efficient transmission of the incident light, through the sub-wavelength grating apertures, into the photo-absorbing semiconductor substrate 12. Additionally, the intensity of the transmitted optical wave is enhanced in close proximity with the plasmonic contact electrodes 50, thereby reducing the average photo-generated carrier transport time to the plasmonic contact electrodes and enabling high quantum efficiency and ultrafast operation simultaneously.

Since electrons have significantly higher mobilities compared to holes and due to the nonlinear increase in the bias electric field near contact electrodes, the optical pump or optical source may be focused onto the photoconductive gap of the photoconductor assembly 16 asymmetrically close to the anode contact of the antenna assembly 14 to maximize terahertz radiation. Put differently, the photoconductive device 10 described herein may be asymmetrically pumped where an optical source pumps just one of the contact electrodes of the antenna assembly 14, or it may be symmetrically pumped where the optical source pumps both of the contact electrodes of the antenna.

In summary, photoconductive source 10 includes a photoconductor assembly 16 with nano-scale plasmonic contact electrodes 50 that significantly reduce the photo-generated carrier transport path and enable ultrafast operation without the need for short-carrier lifetime substrates which may limit the efficiency of conventional photoconductive terahertz sources. The ability to achieve ultrafast operation while maintaining high quantum efficiency may be valuable for future high-power terahertz emitters. The following paragraphs discuss other potential aspects of the photoconductive device 10 and its operation.

Manufacturing—

The following description is of a manufacturing or fabrication process and is directed to a certain non-limiting embodiment where three-dimensional plasmonic contact electrodes and a gallium arsenide (GaAs) semiconductor substrate are used. As already mentioned numerous times, the photoconductive device is not so limited and may include any number of the various features and embodiments described herein. This exemplary fabrication process may start with depositing a $SiO_2$ film followed by patterning a nanoscale metal grating (e.g., Ni) to form a hard mask for etching nanoscale GaAs gratings. The $SiO_2$ film and the underlying GaAs substrate are etched afterwards according to the metal hard mask. Plasmonic contact electrodes may then be formed by sputtering Ti/Au followed by liftoff. Finally, a dielectric (e.g., $SiO_2$) passivation layer can be deposited to cover the top of GaAs gratings.

Use of focused ion-beam to pattern thicker photoresists layers with high aspect ratios is also possible. For a large number of photoconductor arrays, nano-imprinting, self-assembly techniques, and a focused ion-beam may be employed to achieve better uniformity and faster patterning.

Skilled artisans will appreciate that any number of other manufacturing or fabrication processes may be used instead.

Tests, Simulations, Findings, Setups, Etc.—

The following paragraphs, and the figures that they reference, describe different tests, simulations, findings, setups, etc. for exemplary embodiments of photoconductive source 10 and are meant to illustrate various operational aspects of that device. The specific embodiments utilized in these tests and simulations are not meant to be limiting, and are simply provided to further explain or illustrate different features or aspects of the present photoconductive device.

The impact of plasmonic contact electrodes 50 in enhancing the induced photocurrent in ultrafast photoconductors and the radiated terahertz power from photoconductive terahertz emitters is significant. The enhancement concept can be similarly applied to enhance the radiation power from photoconductive terahertz emitters as well as the detection sensitivity of photoconductive terahertz detectors with a variety of terahertz antennas with and without interdigitated contact electrodes, as well as large-area photoconductive devices in both pulsed and continuous-wave operation. Put differently, the various plasmonic contact electrodes disclosed herein may be used with a wide variety of other components, including different semiconductor substrates, antenna assemblies, photoconductor assemblies, lenses, bias networks, etc.

One potential advantage of the proposed photoconductive device 10 is its scalability, which can allow plasmonically enhanced optical transmission into an arbitrarily large device area. This is because the device capacitive parasitic is distributed along the radiating antenna length, so neither degrades antenna efficiency nor antenna impedance matching as a function of frequency. Similar plasmonic electrode configurations may be used to enhance the quantum efficiency of ultrafast distributed photoconductors with closely spaced contact electrodes.

Yet another potential advantage of the proposed photoconductive device 10 is the enhancement of photo-generated carrier concentration near the plasmonic contact electrode regions and the resulting improvement in quantum efficiency.

Another aspect of the proposed photoconductive device 10 involves the ability to suppress the carrier screening effect. The screening effect starts to be effective at high pump intensities, when a large number of photo-generated carriers, accumulated in a small area, screen the carrier drifting electric field. To suppress the carrier screening effect, the maximum pump intensity is determined at which the screening electric field starts degrading the photoconductor terahertz current by reducing the carrier drift velocity. The overall dimensions of the photoconductor can be chosen such that at a given pump power, the pump intensity does not exceed this limit. The pump coupling efficiency, pump/terahertz wave propagation loss, together with the pump/terahertz wave velocity matching requirement have been substantial obstacles to previous photoconductive devices that limit their maximum terahertz output power. Photoconductive source 10 does not face the same limitations associated with traveling-wave distributed photoconductors since the process of pump coupling into the photoconductor and terahertz decoupling out of the photoconductor are usually performed in free space and in parallel, as understood by those skilled in the art.

In order to suppress the carrier screening effect and thermal effects, photoconductive source 10 spreads the high power optical pump on a relatively large photoconductor active area consisting of two-dimensional arrays of plasmonic contact electrodes or elements. In conventional designs, the capacitive loading from a large photoconductor active area can severely limit the photo-generated terahertz current coupled to the radiating antenna because of the RC roll-off. To solve this limitation, photoconductive source 10 integrates photoconductor assembly 16 as a distributed capacitive load along antenna assembly 14.

Yet another potential advantage of photoconductive device 10, compared to other THz sources, is the continuous and broad frequency tunability of the device. The frequency tuning range of photoconductive source 10 with its plasmonic contact electrodes 50, like most other photoconductive THz sources, will be determined by the radiation bandwidth of the employed THz antenna.

According to another potential aspect of the photoconductive device 10, the broad distribution of the optical pump on the two-dimensional plasmonic arrays may help achieve a highly directive output terahertz beam. A highly directional radiation pattern of the proposed photoconductive device 10 can be desirable, especially for terahertz remote sensing and standoff chemical detection applications, where the use of terahertz collimating/focusing components may be restricted. Additionally, output terahertz radiation from the photoconductive device 10 can be controllably deflected by specific distribution of bias voltage applied to photoconductor elements, $V_{bias}^{(i)}$.

Another desirable aspect of the proposed photoconductive device 10 is its high-efficiency operation at or around the 1065 nm and 1550 nm wavelength. In the popular fiber-optic telecommunication band around 1550 nm and 1065 nm, compact erbium-doped and Ytterbium-doped fiber amplifiers have been developed that can boost the power of spectrally-pure laser-diode sources such as external-cavity diode lasers (ECDL) up to tens of watts. While the high tunability of fiber lasers (e.g., about 10 s of nm) allows continuous broadband (e.g., several THz) spectral measurements, their narrow spectral linewidth (e.g., less than 1 MHz) enables accurate identification of chemicals with closely spaced absorption lines (e.g., about 10 s of MHz spacing). Additionally, optical fibers are an ideal environment for combining two frequency offset lasers while consuming a very small volume and a minimal sensitivity to vibrations. For the proposed photoconductor characterization, two commercially available erbium fiber laser (ELT Series) from IPG Photonics may be used as an optical source. This laser offers a wavelength tuning range of 1540-1605 nm, a spectral linewidth of less than 300 KHz, wavelength stability of less than 0.1 nm over 30 minutes, and an output power of up to 25 W with power stability of 0.1 dB. Other optical sources may be used instead, as the preceding is only an example.

Figure 9A:
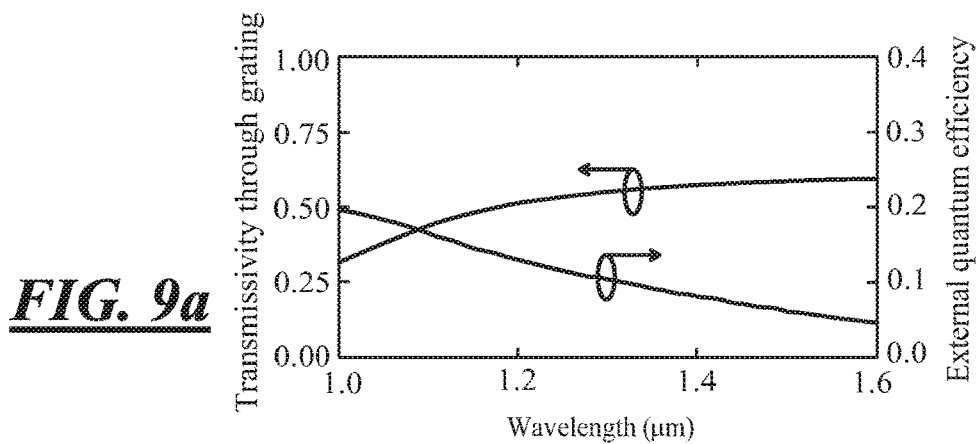
FIGS. 9a-13 are different graphs and schematic illustrations showing various properties of exemplary photoconductive devices and their operation.

Referring back to FIG. 8, there is shown interaction of a TM-polarized optical beam ($\lambda$=1550 nm) with a photoconductor with a gold contact grating (pitch=120 nm, metal width=60 nm) on a thin $In_{0.53}Ga_{0.47}As$ substrate, calculated by a finite-element method solver COMSOL. The arrows (representing the optical power flow direction) show how the propagating light bends on top of the metallic grating to allow high efficiency coupling to the photo-absorbing substrate. As shown in FIG. 8, the optical beam is intensely localized near the corners of the metallic grating, resulting in a very high concentration of photo-generated electron-hole pairs in the immediate vicinity of the photoconductor contact electrodes. As displayed by FIG. 9a, the optical transmission spectrum of the grating is broadband at wavelengths where $In_{0.53}Ga_{0.47}As$ is absorbing, and the InP substrate is transparent. At a wavelength of 1550 nm more than 5% of the incident optical power is absorbed in the 60 nm thick $In_{0.53}Ga_{0.47}As$ layer. The rest of the optical power passes through the transparent substrate without leading to additional heating. FIG. 9a illustrates optical transmission and external quantum efficiency through a gold grating (pitch=120 nm, metal width=60 nm, height=20 nm) into a 60 nm thick $In_{0.53}Ga_{0.47}As$ layer on an InP substrate.

Figure 9B:
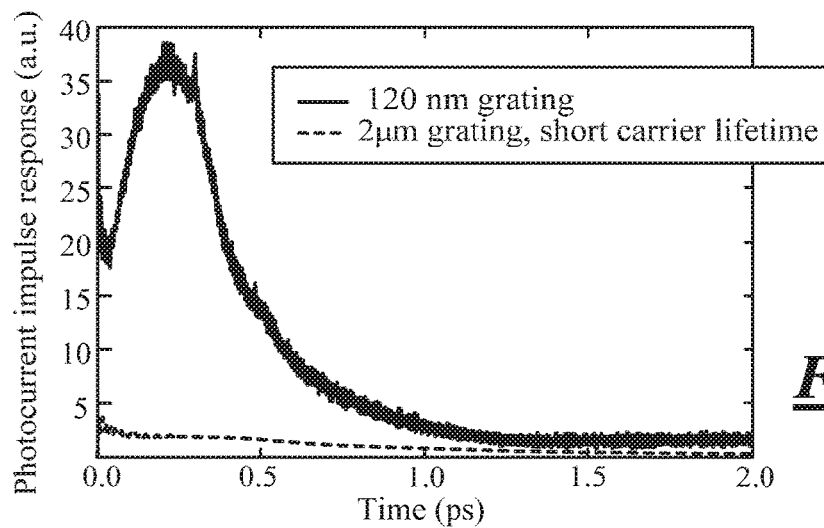

With reference to FIG. 9b, the photocurrent impulse response of the analyzed photoconductor can be calculated by using the optical intensity profile in the substrate, with the assumption that the photocarriers travel along the bias electric field lines, and under a bias voltage of 0.4 V. As a baseline for comparison, the photocurrent impulse response of a conventional photoconductor has been calculated with a contact grating pitch of 2 μm and duty cycle of 0.05 fabricated on an infinitely thick, photo-absorbing $In_{0.53}Ga_{0.47}As$ substrate with a carrier lifetime of 300 fs. The photocurrent impulse responses are normalized by the photoconductor active area and are illustrated in FIG. 9b. Compared with the conventional photoconductor, a photoconductor source 10 with plasmonic contact electrodes 50 may offer an order of magnitude higher photocurrent impulse response. Therefore, integration of photoconductor assembly 16 having a number of plasmonic contact electrodes 50 with the antenna assembly 14 may provide significantly higher terahertz powers than existing photoconductive terahertz sources. Additionally, utilizing certain semiconductor substrate materials, such as $In_{0.53}Ga_{0.47}As$, can make photoconductive source 10 compatible with widely available telecommunication fiber lasers and components. Therefore, photoconductive source 10 is very promising for practical photoconductive terahertz generation, enabling ultrafast and high quantum efficiency operation, simultaneously.

Figure 10A:
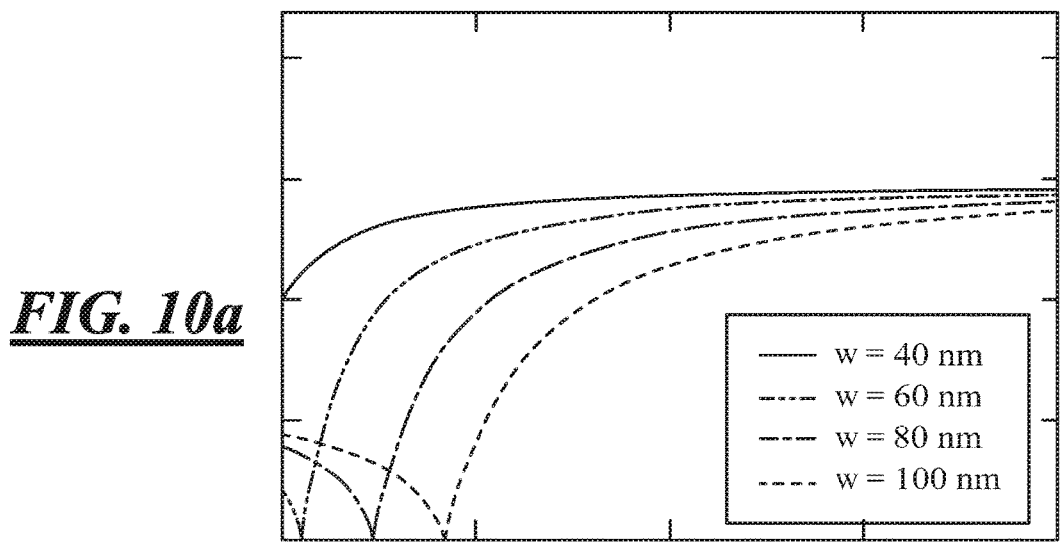
Figure 10B:
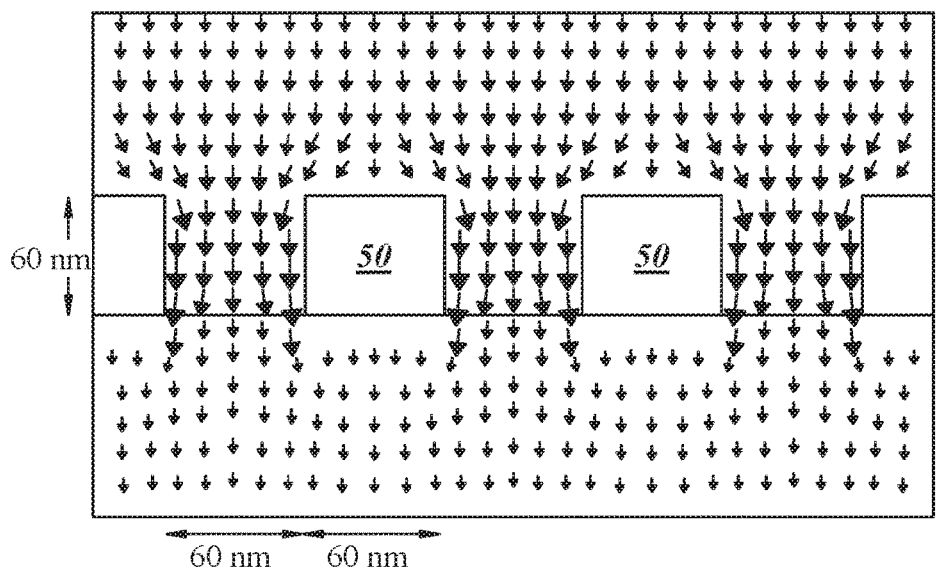

FIGS. 10a-b demonstrate a similar plasmonic enhancement of optical pump transmissivity into a semiconductor substrate that includes a thin top layer 30 made of germanium (Ge), as opposed to InGaAs. More specifically, FIG. 10a illustrates how the transmission of a TM-polarized optical excitation into a germanium (Ge) layer is affected by the plasmonic contact electrode 50 geometry at various optical wavelengths. For a metal thickness of 20 nm, more than 50% transmissivity can be expected at 1550 nm wavelength by using less than 100 nm plasmonic contact electrode width and spacing. The maximum transmissivity is limited by the reflection at the semiconductor-air interface. FIG. 10b, on the other hand, shows a cross-sectional optical power density distribution along a periodic arrangement of plasmonic contact electrodes 50 with 60 nm electrode width and spacing at a 1550 nm pump wavelength. This figure illustrates how the TM-polarized optical field lines are bent on top of the metallic electrodes to achieve a high transmissivity into germanium (Ge) layer 30. It is possible for a plasmonic electrode configuration to offer up to 100% transmissivity by using very thick metal electrodes.

Figure 11:
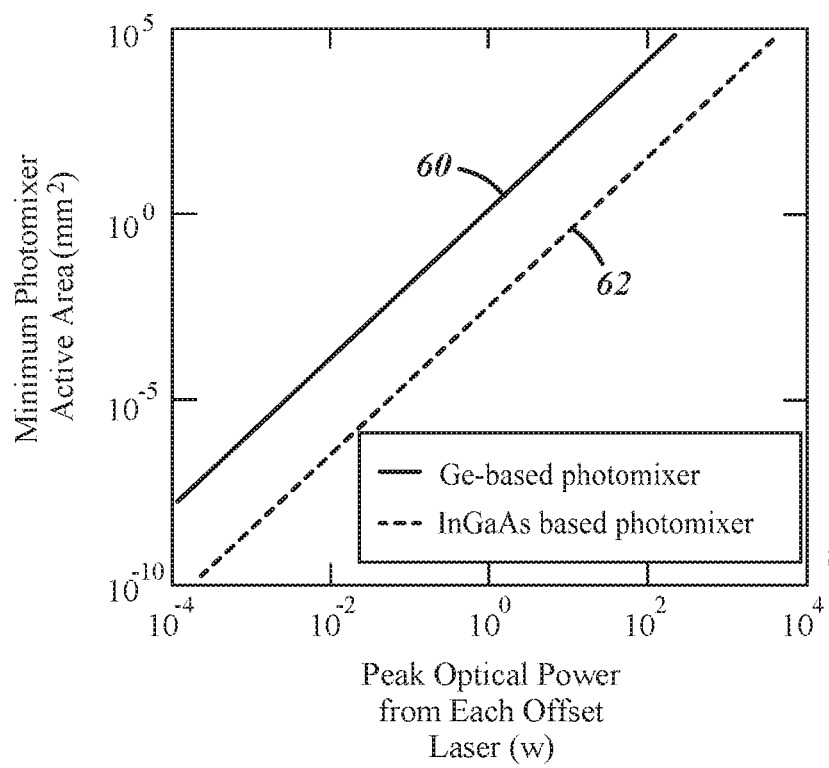

Turning now to FIG. 11, there is shown a graph that illustrates how a photoconductor active area can be scaled as a function of the optical pump power to prevent photoconductor quantum efficiency degradation caused by junction heating. In order to prevent device output power degradation at high pump power levels, semiconductor substrate 12 may be designed so that the junction temperature of the thin top layer 30, such as one made from germanium (Ge), does not exceed the maximum junction temperature (e.g., $T_{J\,max}$=200° C.), above which rapid degradation and device failure can occur. This may allow the maximum optical pump power to be defined as a function of the exposed device area. According to some previous studies on photoconductor thermal heating, the Joule heating, $P_Q$, and the junction temperature, $T_J$, can be approximated by the following formulas:

$$T_j = T_0 + P_Q k \sqrt{(2\pi A)} \quad (1)$$

$$P_Q = (P_{opt1} + P_{opt2})/2 * (1 + RV_B) \approx (P_{opt1} + P_{opt2})/2 * (1 + RE_BW) \quad (2)$$

where $T_0$ is the temperature of the surrounding environment, k is the bulk thermal conductivity, A is the photoconductor active area, $P_{opt1}$ and $P_{opt2}$ represent the incident optical power from the two frequency offset lasers, R represents the photoconductor responsivity (measured to be 0.65 for one of our exemplary embodiments), $V_B$ is the bias voltage across the contact or plasmonic contact electrodes 50 which is approximately $E_{BW}$ at the maximum photoconductor quantum efficiency, $E_B$ is the breakdown field in Ge, and w is the contact or plasmonic contact electrode 50 spacing in the photoconductor. FIG. 11 shows how the photoconductor active area can be scaled as a function of the optical pump power to prevent photoconductor quantum efficiency degradation caused by junction heating; the junction temperature is kept less than 200° C. in this example. Compared to high-defect InGaAs based photoconductors (demonstrated with plot 60), Ge-based photoconductors (demonstrated with plot 62) may allow an order of magnitude higher optical pump powers for the same distributed active area without any degradation in device quantum efficiency. This is attributed to the significantly lower thermal conductivity in certain high-defect semiconductor compounds.

FIGS. 12a-b summarize the process of photo-generated terahertz current coupling into the terahertz radiating dipole antenna assembly and the expected output terahertz power. To address the quantum efficiency limitation of conventional photoconductive terahertz sources based on short-carrier lifetime semiconductors, photoconductive source 10 utilizes nanoscale photoconductor contact electrode gratings to simultaneously achieve both ultrafast and high quantum efficiency operation. This photoconductive terahertz source circumvents the need of a short-carrier lifetime semiconductor substrate, allowing for use of high quality, crystalline substrates. FIG. 12a is a schematic diagram that illustrates operation of a conventional photoconductive terahertz emitter based on short-carrier lifetime photo-absorbing semiconductors, and FIG. 12b illustrates an embodiment of photoconductive source 10 that is based on nanoscale contact electrode gratings on a high-quality crystalline substrate.

FIG. 12b shows the schematic diagram and operation of an exemplary embodiment of photoconductive source 10 based on nanoscale contact electrode gratings. The photoconductor contact electrodes consist of two arrays of nanoscale metallic gratings connected to the input port of a dipole terahertz antenna. The grating periodicity (200 nm) and metal spacing (100 nm) is chosen to be smaller than the wavelength of the incident optical pump. Therefore, the grating geometry can be specifically designed to allow efficient optical transmission through the metallic gratings into the photo-absorbing active region by excitation of surface waves along the periodic metallic grating interface. Compared to conventional photoconductive terahertz sources with contact electrode spacing of ~2 μm, the nanoscale spacing of the contact electrode gratings significantly reduces the photo-generated carrier transport path to the photoconductor contact electrodes. Additionally, the 2 μm separation of the two nanoscale metallic grating arrays maintains low capacitive loading to the terahertz antenna. Moreover, due to the excitation of surface waves along the periodic metallic grating interface, the intensity of the transmitted optical pump is significantly enhanced near the corners of the contact electrodes, further reducing the average transport time of the photo-generated carriers to the contact electrodes. Thus ultrafast photoconductor operation can be achieved while maintaining a high quantum efficiency without the use of semiconductors with defect induced short-carrier lifetimes.

Figure 12C:
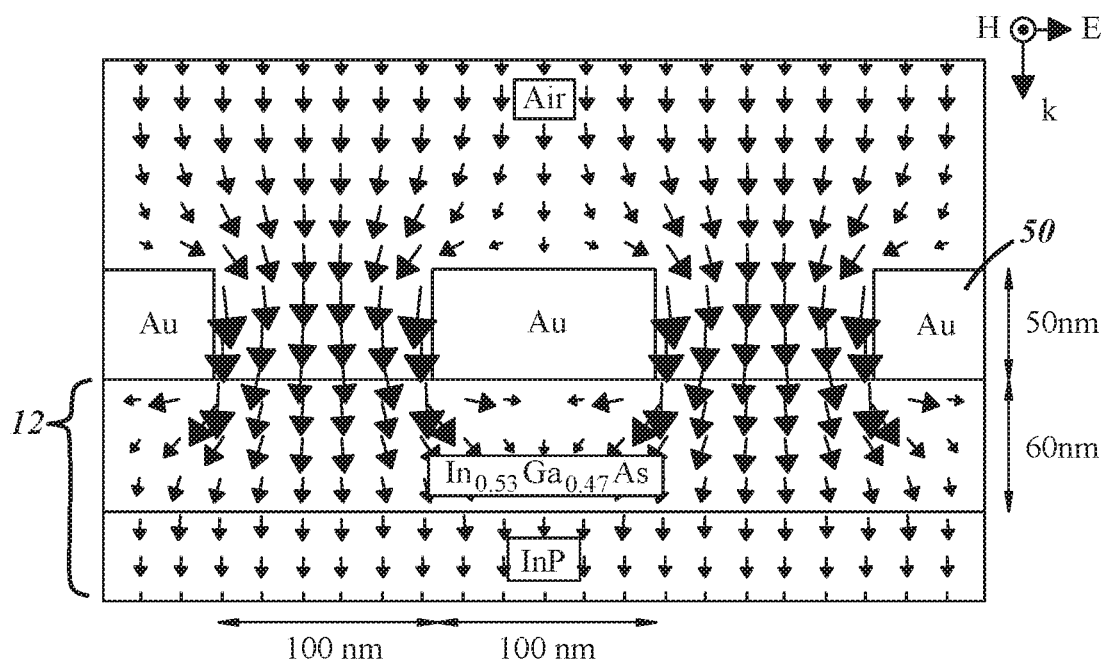

FIG. 12c shows the nanoscale grating designed for enhanced optical absorption for a TM-polarized 1550 nm optical pump. This optical wavelength was chosen due to its compatibility with fiber-optic telecommunication wavelengths at which high power, wavelength tunable, and compact optical sources are commercially available. In order to achieve high optical absorption at 1550 nm pump wavelength, $In_{0.53}Ga_{0.47}As$ is chosen as the photo-absorbing semiconductor. Using a gold grating with a 200 nm periodicity, 100 nm metal spacing, and 50 nm metal thickness, efficient transmission of more than 65% of the incident optical pump into the $In_{0.53}Ga_{0.47}As$ photo-absorbing region is achieved. The thickness of the photo-absorbing $In_{0.53}Ga_{0.47}As$ layer (60 nm) on the InP substrate is chosen to maintain a sub-picosecond device response time and low DC photocurrent by preventing photocarrier generation at deep semiconductor regions that do not contribute to terahertz radiation generation. The photo-generated carrier concentration and optical power flow in the cross section of the designed photoconductor is shown in FIG. 12c. Since the excited surface waves exist at the metal-dielectric interface, regions near the corners of the gold electrodes exhibit the largest generation of carriers. The proximity of these carriers to the electrodes reduces the average carrier transport time.

Figure 12D:
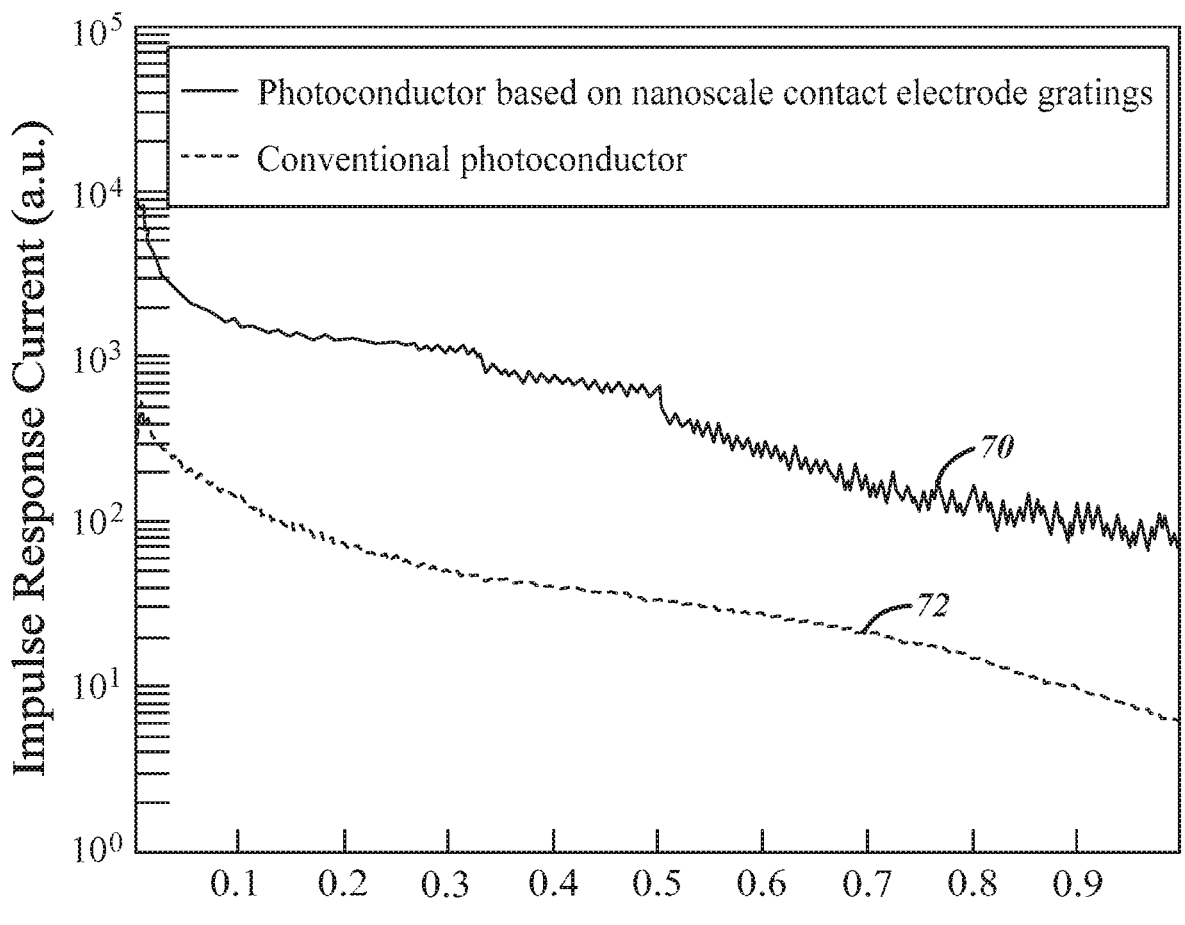

FIG. 12d demonstrates that by combining the photo-generated carrier profile with carrier transport dynamics under the influence of the bias electric field, the impulse response current of the designed photoconductor generated by an optical impulse is calculated and compared with the impulse response current of a conventional photoconductor design with a contact grating pitch of 2 μm and metal width of 100 nm fabricated on an infinitely thick $In_{0.53}Ga_{0.47}As$ substrate with a carrier lifetime of 0.3 ps. The results indicate that the photoconductor based on nanoscale contact electrode gratings (plot 70) may offer an order of magnitude higher impulse response current compared with a conventional photoconductor (plot 72) for the same photoconductor active area and optical pump intensity (FIG. 12d). Plot 70 projects the calculated impulse-response current of the designed photoconductor (with 200 nm grating pitch, 100 nm width, and 50 nm thick Au gratings fabricated on a 60 nm thick $In_{0.53}Ga_{0.47}As$ active layer), and plot 72 projects that of a conventional photoconductor (with a contact grating pitch of 2 μm and metal width of 100 nm on an infinitely thick $In_{0.53}Ga_{0.47}As$ substrate with a carrier lifetime of 0.3 ps).

The frequency tuning range of the exemplary photoconductive THz source is determined by the radiation bandwidth of the employed dipole antenna. It is possible to extend the operation bandwidth of the proposed photoconductor by using plasmonic photoconductor array elements with different dipole antenna lengths, or other antenna configurations with broader radiation frequency (e.g., bow tie, spiral, and log-periodic antennas).

Figure 13:
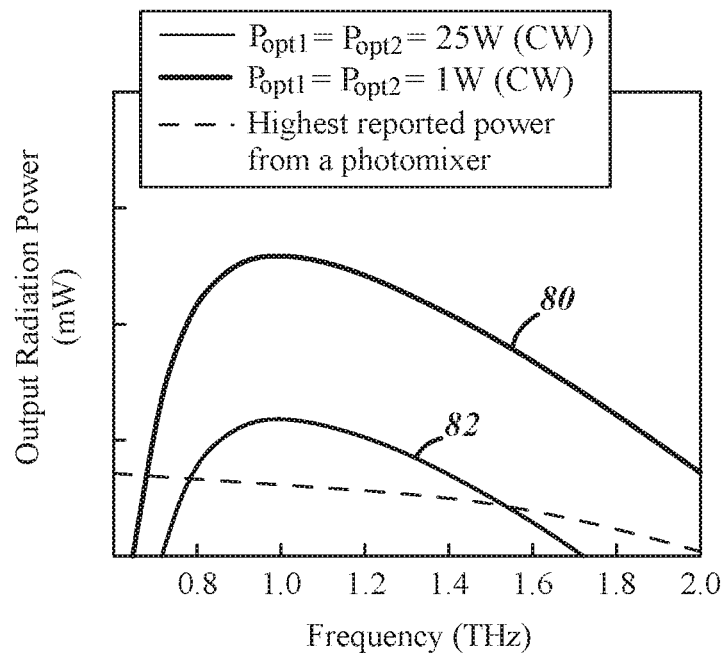

FIG. 13 illustrates the average terahertz output power of an exemplary photoconductive source 10 based on dipole antenna arrays as a function of radiation frequency, and compares it with the terahertz output power of a demonstrated photoconductive source, optimized for the maximum output power at a broad terahertz frequency range. Using two frequency-offset optical pumps with 25 W pump power at 1.55 μm wavelength, a peak output terahertz radiation power of 15.5 mW at 1 THz and more than 1 mW output power is expected over the frequency range of (0.8 THz-1.5 THz). The expected output power (plot 80) is more than three orders of magnitude higher than previously demonstrated photoconductive sources around 1 THz frequency range. FIG. 13 also shows that the output terahertz power of the proposed photoconductor increases quadratically as a function of optical pump power. At very high optical pump powers, the photoconductor active area may be scaled to ensure suppression of the thermal effects and the carrier screening effect and enable quadratic scaling of output terahertz power as a function of optical pump. In FIG. 13, the radiation peak is at the resonance frequency which offers maximum antenna radiation resistance. Potential optical sources include commercially available optical sources for the optical pump which are compact and portable.

Figure 14:
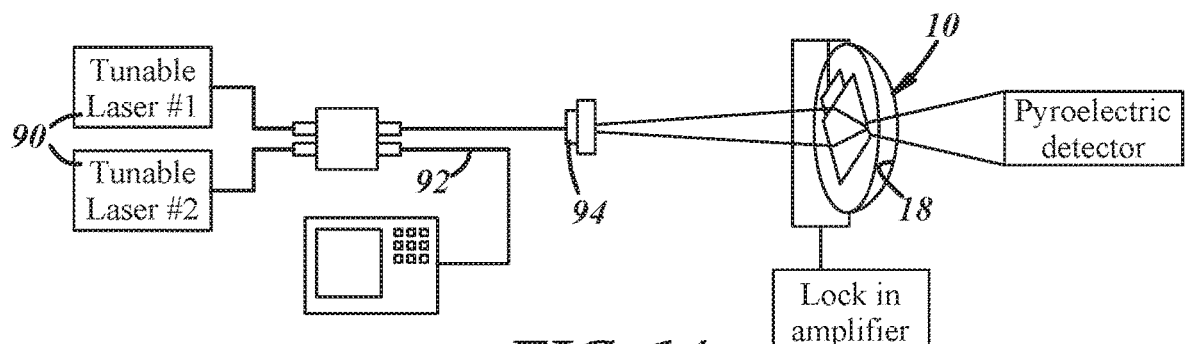
FIGS. 14-15 are illustrations of exemplary setups for characterizing a photoconductive source, such as the one of FIG. 1, as a photoconductive source or emitter.
Figure 15:
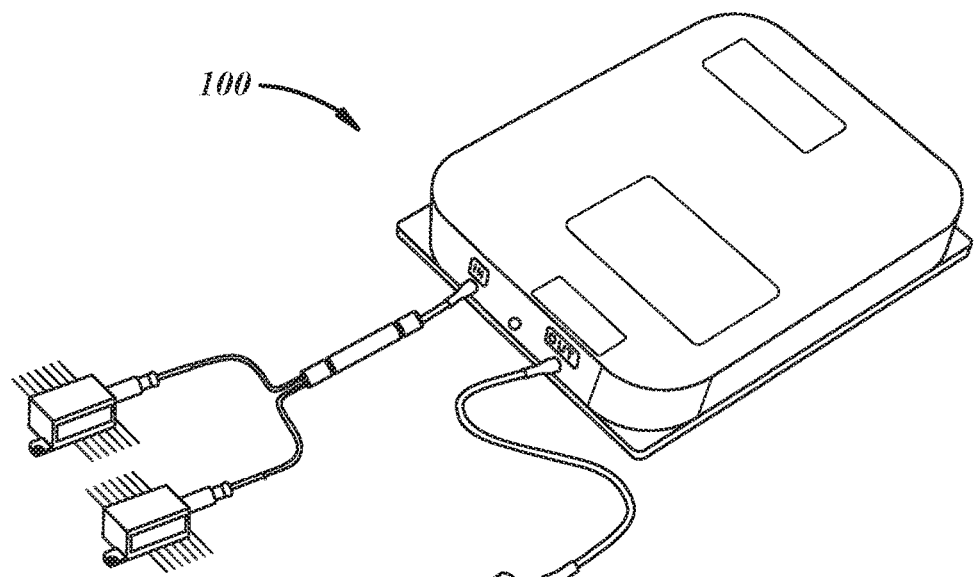
Figure 15:
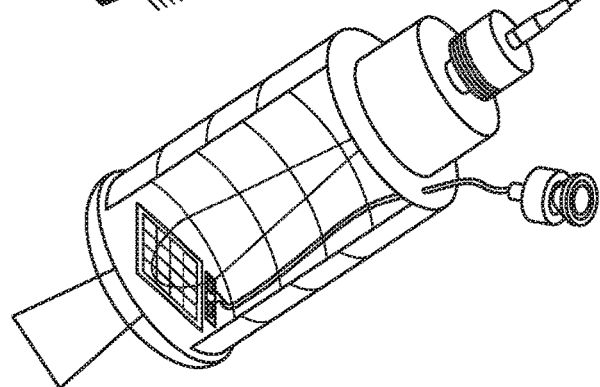

FIG. 14 shows an exemplary setup for characterizing the photoconductive source 10. Two frequency-offset lasers 90 are mixed in a fiber 92 via a 3-dB fiber coupler. A fiber coupled collimator 94 is used to focus the beam on to the photoconductive source 10. For pump powers beyond 10 W, free-space coupling may be used to prevent fiber melting. The output terahertz beam is coupled to free space via a hyper-hemispherical Si lens 18 with 5 mm radius and 1.76 mm setback, and sensed with a pyroelectric detector. A chopper and lock in amplifier can be used to filter out the low frequency noise of the pyroelectric detector. FIG. 15 illustrates one possible embodiment of a next generation compact, cost-efficient, and high power tunable photoconductive source 100 based on the plasmonic distributed photoconductor described herein.

Figure 16A:
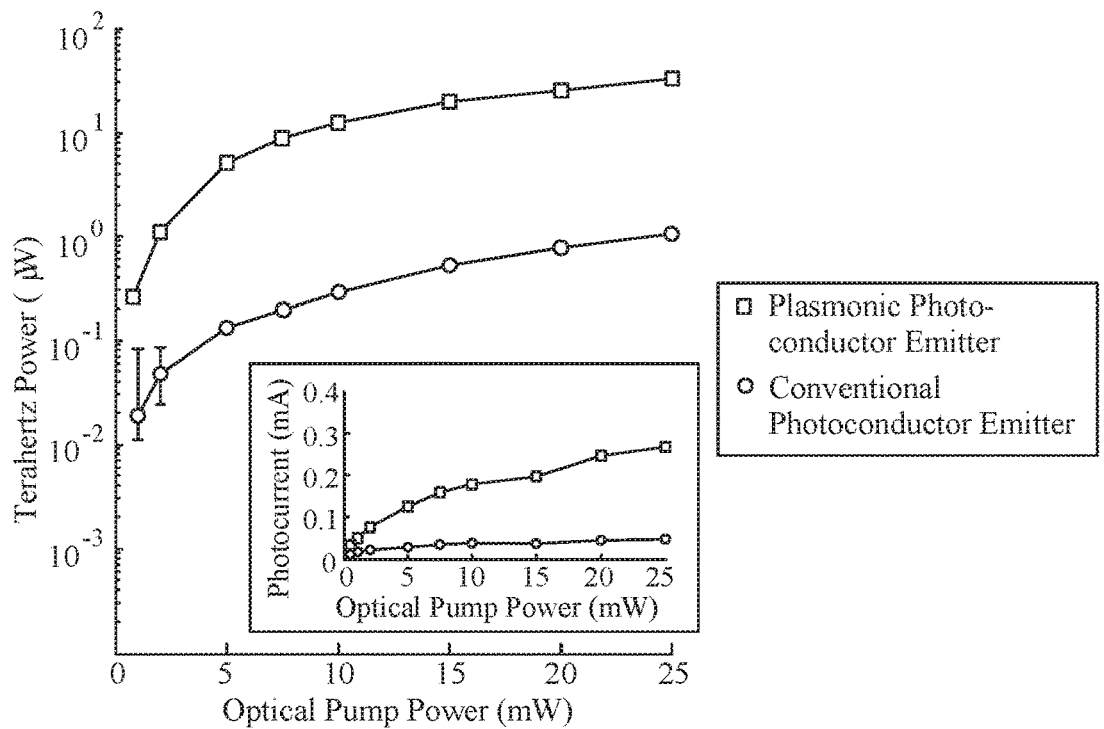
FIGS. 16a-d are different graphs comparing a conventional photoconductive terahertz source with an exemplary photoconductive source, such as the one of FIG. 1, which has a number of nano-spaced plasmonic contact electrodes.
Figure 16B:
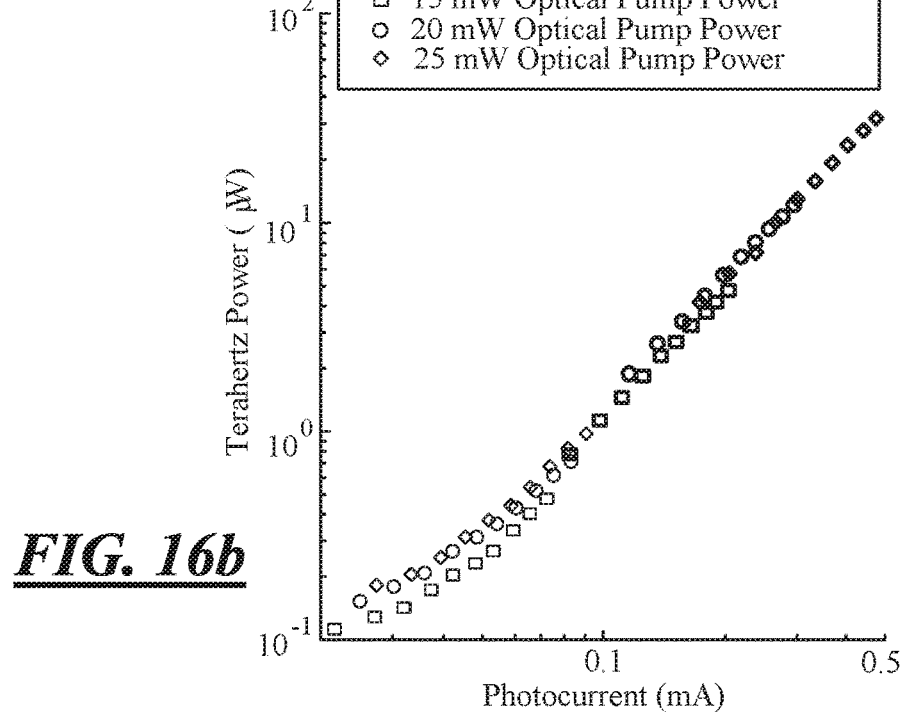
Figure 16C:
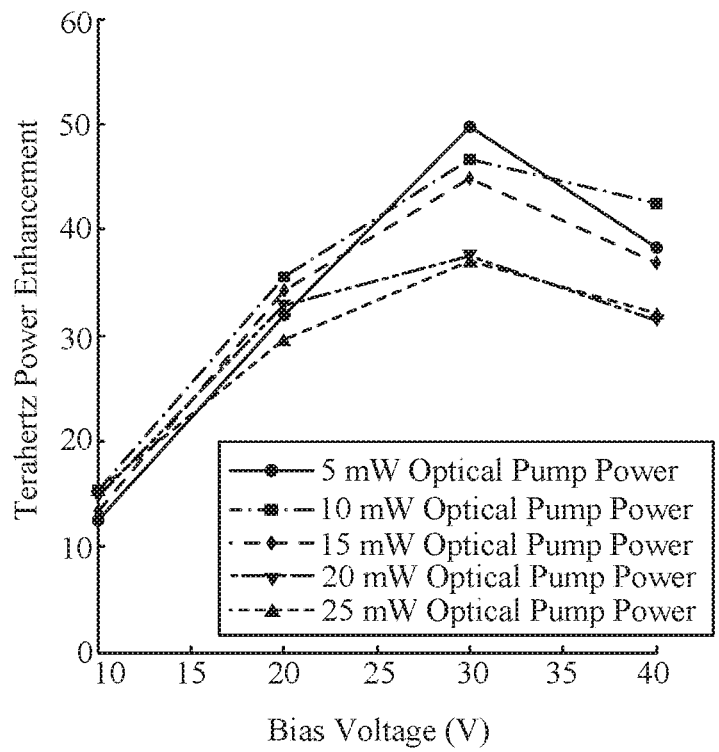
Figure 16D:
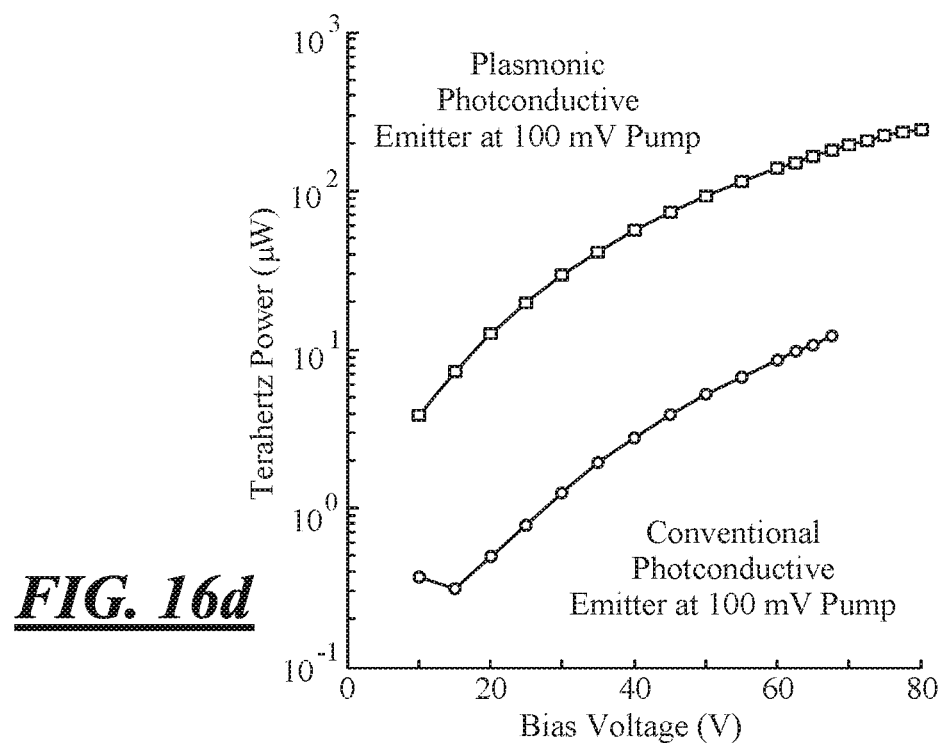

FIGS. 16a-d compare a conventional photoconductive terahertz source with photoconductive source 10 having a number of nano-spaced plasmonic contact electrodes. In FIG. 16a, there is plotted measured terahertz radiation from the plasmonic and conventional terahertz emitters, electrically biased at 40 V, under various optical pump powers. The inset curve shows the corresponding photocurrent. The error bars are associated with the noise of a pyroelectric terahertz detector. FIG. 16b shows measured terahertz radiation versus collected photocurrent for the plasmonic and conventional terahertz emitters. The data represented in the plot includes various bias voltages (10-40 V) under various optical pump powers (5-25 mW). In FIG. 16c, relative terahertz power enhancement, which is defined as the ratio of the terahertz power emitted by the plasmonic terahertz emitter to the conventional terahertz emitter, is shown. Maximum enhancement is obtained at low optical powers before the onset of the carrier screening effect. And in FIG. 16d, maximum terahertz power measured from the plasmonic and conventional terahertz emitters under a 100 mW optical pump is illustrated. The bias voltage of each device is increased until the point of device failure.

It is to be understood that the foregoing description is not a definition of the invention, but is a description of one or more preferred exemplary embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. All such embodiments, changes, and modifications are intended to come within the scope of the appended claims.

As used in this specification and claims, the terms "for example," "e.g.," "for instance," "such as," and "like," and the verbs "comprising," "having," "including," and their other verb forms, when used in conjunction with a listing of one or more components or other items, are each to be construed as open-ended, meaning that that the listing is not to be considered as excluding other, additional components or items. Other terms are to be construed using their broadest reasonable meaning unless they are used in a context that requires a different interpretation.

The invention claimed is:

1. A photoconductive device for detecting terahertz (THz) radiation, comprising:
   a semiconductor substrate;
   an antenna assembly fabricated on the semiconductor substrate; and
   a photoconductor assembly fabricated on the semiconductor substrate and coupled to the antenna assembly, wherein the photoconductor assembly includes a plurality of plasmonic contact electrodes and wherein the photoconductive device is configured to receive optical input that impinges upon the photoconductor assembly and the plasmonic contact electrodes such that charge carriers are generated in the semiconductor substrate adjacent the plasmonic contact electrodes in response to the impinging optical input;
   wherein the plasmonic contact electrodes have sub-wavelength electrode spacing compared to at least one wavelength of the optical input, and wherein the plasmonic contact electrodes are configured to collect the generated charge carriers and are electrically connected to the antenna assembly, whereby the plasmonic contact electrodes provide improved quantum efficiency of the photoconductive device when receiving the optical input.

2. The photoconductive device of claim 1, wherein the semiconductor substrate includes a first thin layer formed on a second thicker layer, and the photoconductor assembly is fabricated on the first thin layer.

3. The photoconductive device of claim 2, wherein the first thin layer of the semiconductor substrate includes at least one material selected from the list consisting of: sapphire, silicon (Si), germanium (Ge), silicon germanium (SiGe), indium gallium arsenide (InGaAs), gallium arsenide (GaAs), indium gallium nitride (InGaN), indium phosphide (InP), Graphene or compounds thereof.

4. The photoconductive device of claim 2, wherein the first thin layer of the semiconductor substrate includes a low-defect thin film with a crystalline structure that is grown on the second thicker layer.

5. The photoconductive device of claim 2, wherein the first thin layer has a thermal conductivity that is equal to or greater than $0.1$ W cm$^{-1}$ °C.$^{-1}$.

6. The photoconductive device of claim 1, further comprising a dielectric passivation layer formed on the semiconductor substrate, wherein the dielectric passivation layer encapsulates at least a portion of the plasmonic contact electrodes and enhances optical pump transmission into the semiconductor substrate.

7. The photoconductive device of claim 6, wherein the dielectric passivation layer includes at least one material selected from the list consisting of: SiN, $Si_3N_4$, or $SiO_2$.

8. The photoconductive device of claim 1, wherein the antenna assembly includes at least one antenna type selected from the list consisting of: a monopole antenna, butterfly antenna, a dipole antenna, a spiral-type antenna, a folded dipole antenna, a log-periodic antenna, or a bow tie-type antenna.

9. The photoconductive device of claim 1, wherein the plasmonic contact electrodes have a sub-wavelength periodicity, electrode width and electrode spacing that are all less than the wavelength of the optical input.

10. The photoconductive device of claim 1, wherein the plasmonic contact electrodes are arranged so that the intensity of the optical input is concentrated near the plasmonic contact electrodes such that a high concentration of photo-generated electron-hole pairs are located in the immediate vicinity of the plasmonic contact electrodes.

11. The photoconductive device of claim 1, wherein the plasmonic contact electrodes are configured according to at least one shape selected from the list consisting of: a grating, a rectangular-shape, a cross-shape, a C-shape, a H-shape, a split-ring-resonator, a circular hole, or a rectangular hole.

12. The photoconductive device of claim 1, wherein the plasmonic contact electrodes are metallic electrodes and include at least one metal selected from the list consisting of: gold (Au), silver (Ag), titanium (Ti), or nickel (Ni).

13. The photoconductive device of claim 1, wherein the plasmonic contact electrodes are integrally formed with the antenna assembly and extend from the antenna assembly.

14. The photoconductive device of claim 1, wherein the plasmonic contact electrodes are separately formed from the antenna assembly and are connected to the antenna assembly.

15. The photoconductive device of claim 1, wherein the plasmonic contact electrodes are two-dimensional electrodes that have a height dimension that is less than a width or length dimension.

16. The photoconductive device of claim 1, wherein the plasmonic contact electrodes are three-dimensional electrodes that have a height dimension that is greater than a width or length dimension.

17. The photoconductive device of claim 1, wherein the antenna assembly includes a first antenna terminal coupled to a first lead of the photoconductive device and a second antenna terminal coupled to a second lead of the photoconductive device, and wherein the photoconductor assembly is at least partially located between the first and second antenna terminals.

18. The photoconductive device of claim 17, wherein the plurality of plasmonic contact electrodes includes a first plurality of the plasmonic contact electrodes electrically coupled to the first antenna terminal and a second plurality of the plasmonic contact electrodes electrically coupled to the second antenna terminal.

19. The photoconductive device of claim 18, wherein each of the first and second pluralities of plasmonic contact electrodes are configured as parallel electrodes in a periodic array having sub-wavelength periodicity that excites surface plasmon waves.

\* \* \* \* \*